(12) United States Patent
Endo

(10) Patent No.: US 9,083,310 B2
(45) Date of Patent: Jul. 14, 2015

(54) LAMINATED STRUCTURAL TYPE BALUN

(75) Inventor: Makoto Endo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 465 days.

(21) Appl. No.: 13/541,305

(22) Filed: Jul. 3, 2012

(65) Prior Publication Data

US 2014/0009241 A1  Jan. 9, 2014

(51) Int. Cl.
*H03H 7/42* (2006.01)
*H01P 3/08* (2006.01)
*H03H 1/00* (2006.01)

(52) U.S. Cl.
CPC ......... *H03H 7/42* (2013.01); *H03H 2001/0085* (2013.01)

(58) Field of Classification Search
CPC .............. H03H 5/00; H03H 7/42; H01P 5/10
USPC ............................................. 333/25, 26, 238
See application file for complete search history.

(56) References Cited

U.S. PATENT DOCUMENTS

| | | | |
|---|---|---|---|
| 5,949,299 A | 9/1999 | Harada | |
| 7,005,956 B2* | 2/2006 | Wang | 336/200 |
| 7,116,185 B2* | 10/2006 | Ohi et al. | 333/25 |
| 7,330,085 B2* | 2/2008 | Ezzeddine | 333/26 |
| 2003/0184403 A1 | 10/2003 | Goyette et al. | |
| 2005/0116787 A1 | 6/2005 | Ohi et al. | |
| 2007/0190954 A1 | 8/2007 | Murakami et al. | |
| 2007/0268092 A1 | 11/2007 | Inoue et al. | |

FOREIGN PATENT DOCUMENTS

| | | |
|---|---|---|
| CN | 1622452A A | 6/2005 |
| EP | 1 731 006 A1 | 12/2006 |
| JP | A-10-200360 | 7/1998 |
| JP | H10200360 A | 7/1998 |
| JP | A-2000-236227 | 8/2000 |
| JP | A-2002-43883 | 2/2002 |
| JP | A-2003-324330 | 11/2003 |
| JP | A-2007-312324 | 11/2007 |
| JP | A-2010-154517 | 7/2010 |
| KR | 20080100633 A | 11/2008 |
| WO | WO 2005/088833 A1 | 9/2005 |

OTHER PUBLICATIONS

Kuylenstierna et al., "Is the Second Order Lattice Balun a good solution in MMICs—A Comparison with a Direct-Coupled Transformer Balun," *IEEE*, 2005, pp. 539-542.

(Continued)

*Primary Examiner* — Dean Takaoka
(74) *Attorney, Agent, or Firm* — Oliff PLC

(57) ABSTRACT

A laminated structural type balun includes a low pass filter that is provided between an unbalanced terminal inputting and outputting unbalanced signals and a first balanced terminal inputting and outputting balanced signals and includes a first coil and a first capacitor; and a high pass filter that is provided between the unbalanced terminal and a second balanced terminal inputting and outputting balanced signals and includes a second capacitor and a second coil. The first capacitor and the second capacitor are arranged in a different area from the first coil and the second coil in a laminated direction.

21 Claims, 30 Drawing Sheets

(56) References Cited

OTHER PUBLICATIONS

Chiou et al., "Lumped-Element Compensated High/Low-Pass Balun Design for MMIC Double-Balanced Mixer," *IEEE Microwave and Guided Wave Letters*, Aug. 1997, pp. 248-250, vol. 7, No. 8, published by IEEE.

Extended European Search Report issued in European Application No. 12175318 dated Nov. 22, 2012.

* cited by examiner

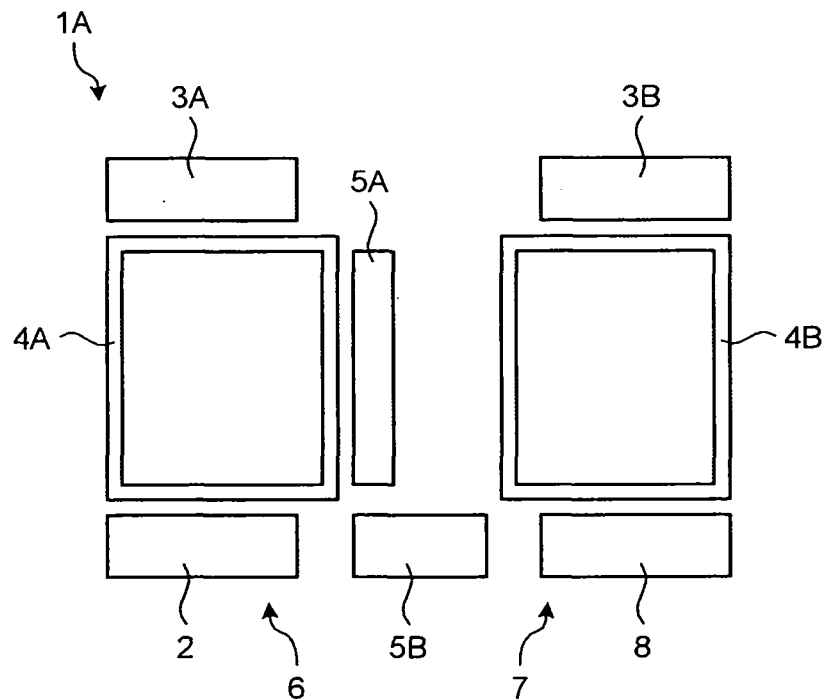
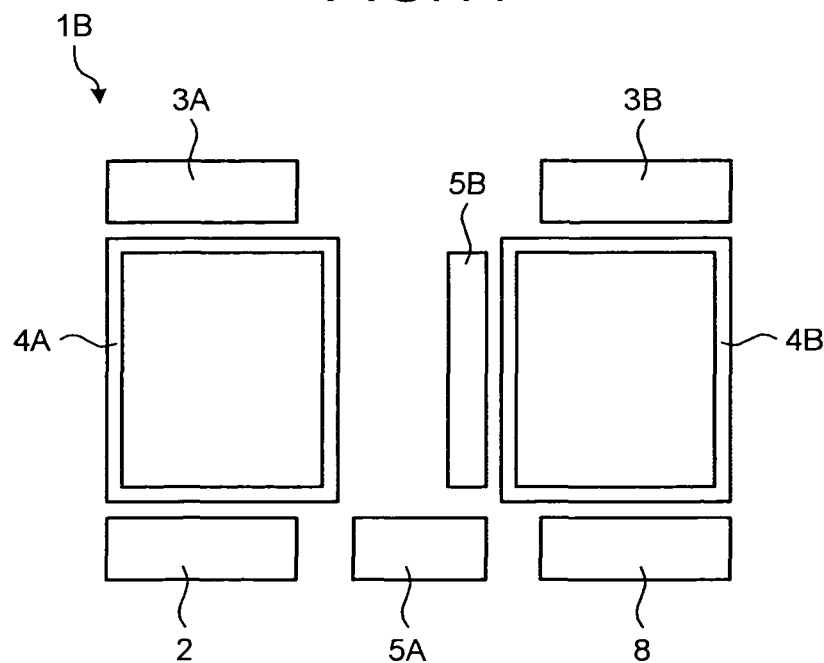

INSERTION LOSS

PHASE DIFFERENCE

REFLECTION LOSS

AMPLITUDE DIFFERENCE

INSERTION LOSS

PHASE DIFFERENCE

INSERTION LOSS

PHASE DIFFERENCE

INSERTION LOSS

PHASE DIFFERENCE

REFLECTION LOSS

AMPLITUDE DIFFERENCE

INSERTION LOSS

PHASE DIFFERENCE

REFLECTION LOSS

AMPLITUDE DIFFERENCE

LAMINATED STRUCTURAL TYPE BALUN

BACKGROUND OF THE INVENTION

1. Field of the Invention

The present invention relates to a laminated structural type balun that is a component converting balanced signals and unbalanced signals mutually.

2. Description of the Related Art

A balun is a component converting balanced signals and unbalanced signals mutually. Some baluns use a high pass filter (HPF) and a low pass filter (LPF) in combination (see Japanese Patent Application Laid-open No. 2000-236227 and Japanese Patent Application Laid-open No. H10-200360, for example). A balun having this type of structure has a conversion input and a conversion output that are electrically connected. For this reason, for example, as compared with an electromagnetic coupling type balun, the insertion loss is smaller, and the matching of input and output impedances is also possible at the same time as balanced and unbalanced signal conversion. In addition, Japanese Patent Application Laid-open No. 2000-236227 and Japanese Patent Application Laid-open No. H10-200360 decribe a laminated structural balun (laminated structural type balun) in which a conductor pattern is formed between insulating layers.

The baluns described in Japanese Patent Application Laid-open No. 2000-236227 and Japanese Patent Application Laid-open No. H10-200360 leave room for improvement in electrical properties.

SUMMARY OF THE INVENTION

According to an aspect of the present invention, there is provided a laminated structural type balun including: a low pass filter that is provided between an unbalanced terminal inputting and outputting unbalanced signals and a first balanced terminal inputting and outputting balanced signals and includes a first coil and a first capacitor; a high pass filter that is provided between the unbalanced terminal and a second balanced terminal inputting and outputting balanced signals and includes a second capacitor and a second coil; and a laminated body that includes a plurality of layers including a plurality of conductor layers having a conductor pattern and a plurality of insulating layers being laminated on a surface of a substrate and includes the low pass filter and the high pass filter, wherein the first capacitor and the second capacitor are arranged in a different area from the first coil and the second coil when viewed from a laminated direction of the laminated body.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 10 is a plane view of a balun in a second embodiment of the present invention;

FIG. 11 is a plane view of a balun in a third embodiment of the present invention;

DETAILED DESCRIPTION OF THE PREFERRED EMBODIMENTS

First Embodiment

Figure 1:
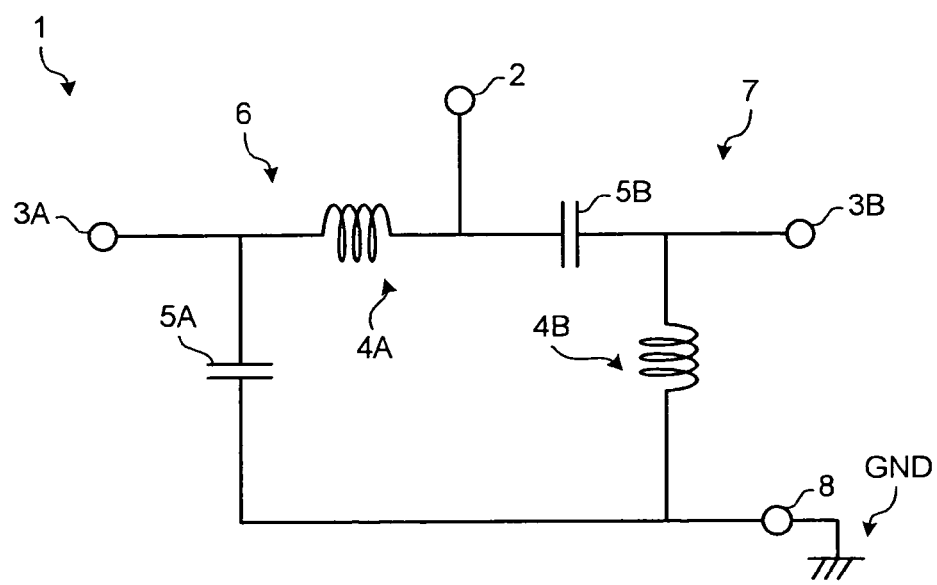
FIG. 1 is a circuit diagram illustrating an equivalent circuit of a laminated structural type balun in a first embodiment of the present invention.

FIG. 1 is a circuit diagram illustrating an equivalent circuit of a laminated structural type balun in a first embodiment of the present invention. A laminated structural type balun (hereinafter referred to as a balun if necessary) 1 is an LC type balun. The LC type balun is a component in which the low pass filter (LPF) and the high pass filter (HPF), each composed of an L (coil) and a C (capacitor), are combined to convert balanced signals and unbalanced signals mutually. The unbalanced signal is a signal having ground potential as reference potential. The balanced signal is a signal composed of two signals having a phase different by approximately 180 degrees ($\pi$) from each other and having approximately the same amplitude.

In the embodiment, the balun 1 includes an unbalanced terminal 2, a first balanced terminal 3A, a second balanced terminal 3B, a low pass filter 6 having a first coil 4A and a first capacitor 5A, and a high pass filter 7 having a second coil 4B and a second capacitor 5B. The balun 1 further includes a ground terminal 8. The ground terminal 8 is connected to a ground GND. The unbalanced terminal 2 inputs and outputs unbalanced signals. The first balanced terminal 3A and the second balanced terminal 3B both input and output balanced signals. The low pass filter 6 is arranged between the unbalanced terminal 2 and the first balanced terminal 3A. The high pass filter 7 is arranged between the unbalanced terminal 2 and the second balanced terminal 3B.

Regarding the low pass filter 6, the first coil 4A is connected between the unbalanced terminal 2 and the first balanced terminal 3A, and the first capacitor 5A is connected between the first balanced terminal 3A and the ground terminal 8. That is, the first coil 4A is in series with respect to a first signal flowing between the unbalanced terminal 2 and the first balanced terminal 3A, while the first capacitor 5A is in parallel with respect to the first signal. Regarding the high pass filter 7, the second capacitor 5B is connected between the unbalanced terminal 2 and the second balanced terminal 3B, and the second coil 4B is connected between the second balanced terminal 3B and the ground terminal 8. That is, the second coil 4B is in parallel with respect to a second signal flowing between the unbalanced terminal 2 and the second balanced terminal 3B, while the second capacitor 5B is in series with respect to the second signal.

The low pass filter 6 and the high pass filter 7 each has a circuit configuration with a coil and a capacitor. The constants of the first coil 4A and the first capacitor 5A of the low pass filter 6 and those of the second coil 4B and the second capacitor 5B of the high pass filter 7 vary depending on the specification of the balun 1, and are set so that impedance matching is achieved at a targeted frequency. The shape of the first coil 4A and the second coil 4B is not limited to a specified one as long as magnetic coupling intended in the balun 1 is realized, and can be arbitrary such as of swirl (coil), meander, straight line, or curved line, for example.

Figure 2:
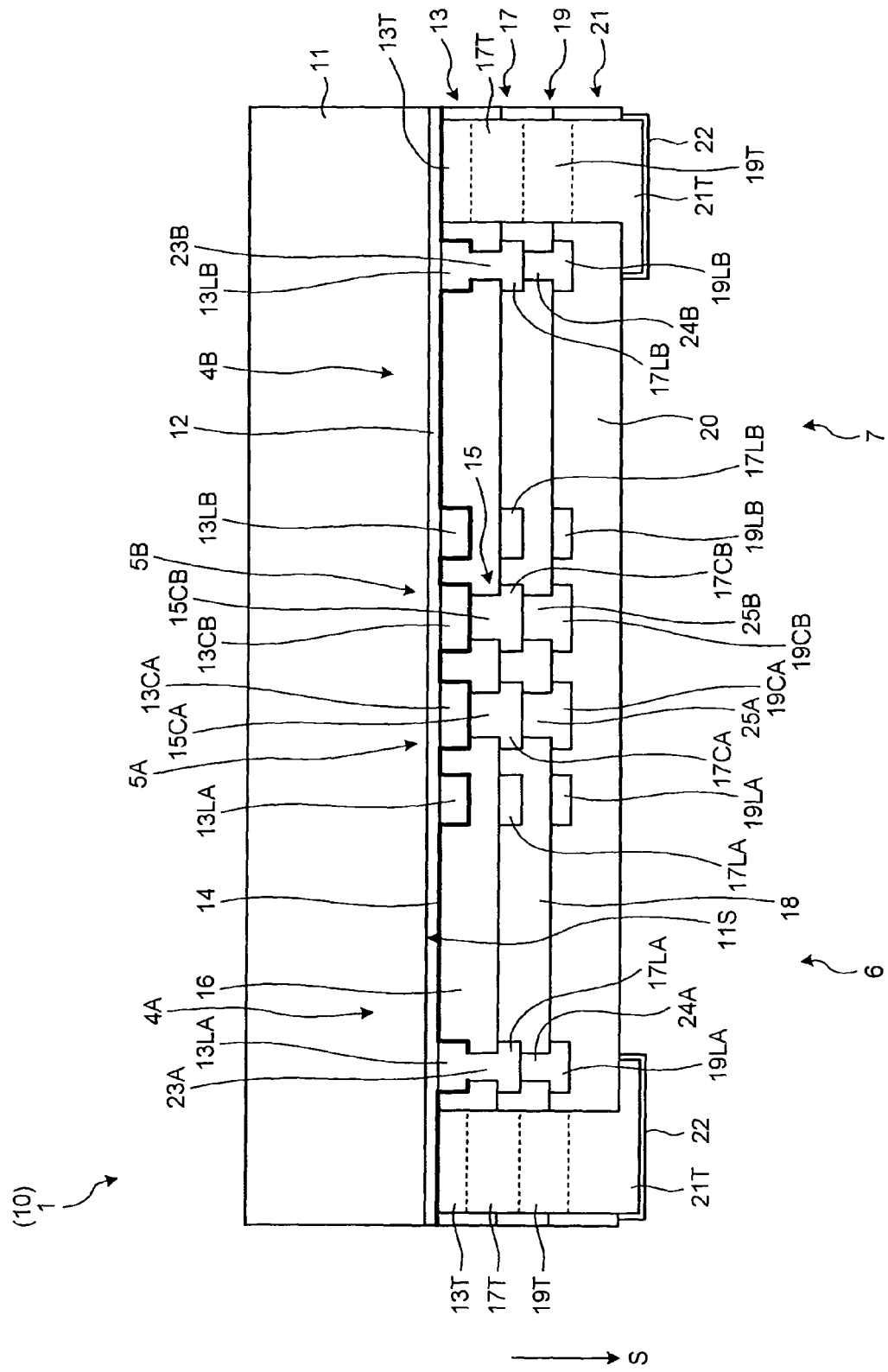
FIG. 2 is a cross-sectional view illustrating a structure of the balun in the first embodiment.

FIG. 2 is a cross-sectional view illustrating a structure of the balun in the first embodiment. The balun 1 includes a laminated body 10. The laminated body 10 has a plurality of layers including a plurality of conductor layers having conductor patterns and a plurality of insulating layers that are laminated on a substrate, and the above-described low pass filter 6 and the high pass filter 7. In the embodiment, a laminated direction of the laminated body 10 is a direction separating from a surface 11S of a substrate 11 on which the conductor layers and the insulating layers are formed (a direction represented by an arrow S in FIG. 2).

The substrate 11 is an insulating substrate such as of ferrite, for example. The substrate 11 has, on the surface 11S on which the conductor layers and the insulating layers are formed, a smooth layer 12 filling concavity and convexity to smooth the surface 11S. On the surface of the smooth layer 12, a first conductor layer 13, a dielectric layer 14, an intermediate conductor layer 15, a first insulating layer 16, a second conductor layer 17, a second insulating layer 18, a third conductor layer 19, a third insulating layer (overcoat layer) 20, a fourth conductor layer 21, and a terminal plating layer 22 are laminated in this order.

The first conductor layer 13, the intermediate conductor layer 15, the second conductor layer 17, the third conductor layer 19, the fourth conductor layer 21 correspond to the conductor layers. These conductor layers are conductor layers of copper, silver, or the like, and form a pattern (conductor pattern) such as a wiring pattern or a terminal pattern. The first conductor layer 13 has a first coil conductor 13LA to be the first coil 4A, a second coil conductor 13LB to be the second coil 4B, a first capacitor substrate-side electrode 13CA to be one of electrodes of the first capacitor 5A, a second capacitor substrate-side electrode 13CB to be one of electrodes of the second capacitor 5B, and terminal conductors 13T to be the unbalanced terminal 2, the ground terminal 8, etc., that are illustrated in FIG. 1. The intermediate conductor layer 15 has a first capacitor opposite electrode 15CA to be the other of electrodes of the first capacitor 5A and a second capacitor opposite electrode 15CB to be the other of electrodes of the second capacitor 5B.

The second conductor layer 17 has a first coil conductor 17LA to be the first coil 4A, a second coil conductor 17LB to be the second coil 4B, a first capacitor electrode 17CA connected to the first capacitor opposite electrode 15CA, a second capacitor electrode 17CB connected to the second capacitor opposite electrode 15CB, and terminal conductors 17T to be the unbalanced terminal 2, the ground terminal 8, etc., that are illustrated in FIG. 1. The third conductor layer 19 has a first coil conductor 19LA to be the first coil 4A, a second coil conductor 19LB to be the second coil 4B, a first capacitor electrode 19CA connected to the first capacitor electrode 17CA, a second capacitor electrode 19CB connected to the second capacitor electrode 17CB, and terminal conductors 19T to be the unbalanced terminal 2, the ground terminal 8, etc., that are illustrated in FIG. 1. The fourth conductor layer 21 has terminal conductors 21T for taking out the unbalanced terminal 2 or the ground terminal 8 illustrated in FIG. 1 onto the surface of the laminated body 10. The surface of the terminal conductor 21T is covered with the terminal plating layer 22. The terminal conductor 21T protrudes from the surface of the laminated body 10 to be the unbalanced terminal 2, the first balanced terminal 3A, the second balanced terminal 3B, and the ground terminal 8.

The first coil conductor 13LA of the first conductor layer 13 and the first coil conductor 17LA of the second conductor layer 17 are connected to each other with a via 23A. Similarly, the second coil conductor 13LB of the first conductor layer 13 and the second coil conductor 17LB of the second conductor layer 17 are connected to each other with a via 23B. Moreover, the first coil conductor 17LA of the second conductor layer 17 and the first coil conductor 19LA of the third conductor layer 19 are connected to each other with a via 24A. Similarly, the second coil conductor 17LB of the second conductor layer 17 and the second coil conductor 19LB of the third conductor layer 19 are connected to each other with a via 24B. The first capacitor electrode 17CA of the second conductor layer 17 and the first capacitor electrode 19CA of the third conductor layer 19 are connected to each other with a via 25A, and the second capacitor electrode 17CB of the second conductor layer 17 and the second capacitor electrode 19CB of the third conductor layer 19 are connected to each other with a via 25B. The terminal conductors 17T, 19T, and 21T are connected in the second conductor layer 17, the third conductor layer 19 and the fourth conductor layer 21, respectively.

The first insulating layer 16, the dielectric layer 14, the second insulating layer 18, and the third insulating layer 20 correspond to the insulating layers. The first insulating layer 16, the second insulating layer 18, and the third insulating layer 20 are made of insulating material. As the insulating material, polyimide or epoxy resin is used, for example. As the material of the dielectric layer 14, silicon nitride (SiN), etc., is used. The dielectric layer 14 is interposed between the first conductor layer 13 and the intermediate conductor layer 15 to electrically isolate them from each other. The dielectric layer 14 is interposed between the first capacitor substrate-side electrode 13CA and the first capacitor opposite electrode 15CA and between the second capacitor substrate-side electrode 13CB and the second capacitor opposite electrode 15CB to constitute, together with these components, the first capacitor 5A and the second capacitor 5B. The first insulating layer 16 is interposed between the dielectric layer 14 and the second conductor layer 17 to electrically isolate them from each other. The first insulating layer 16 has opening portions for electrically connecting between the first conductor layer 13 and the second conductor layer 17 and between the intermediate conductor layer 15 and the second conductor layer 17 through the vias 23A and 23B. The second insulating layer 18 is interposed between the second conductor layer 17 and the third conductor layer 19 to electrically isolate them from each other. The second insulating layer 18 has opening portions for electrically connecting between the third conductor layer 19 and the second conductor layer 17 through the vias 24A, 25A, 24B and 25B. The third insulating layer 20 covers the surface of the third conductor layer 19 to protect it from physical damages from the outside of the product. The laminated body 10 of the balun 1 has the structure that is described above. Next, a planar structure of each conductor layer of the balun 1 is described in detail.

Figure 3A:
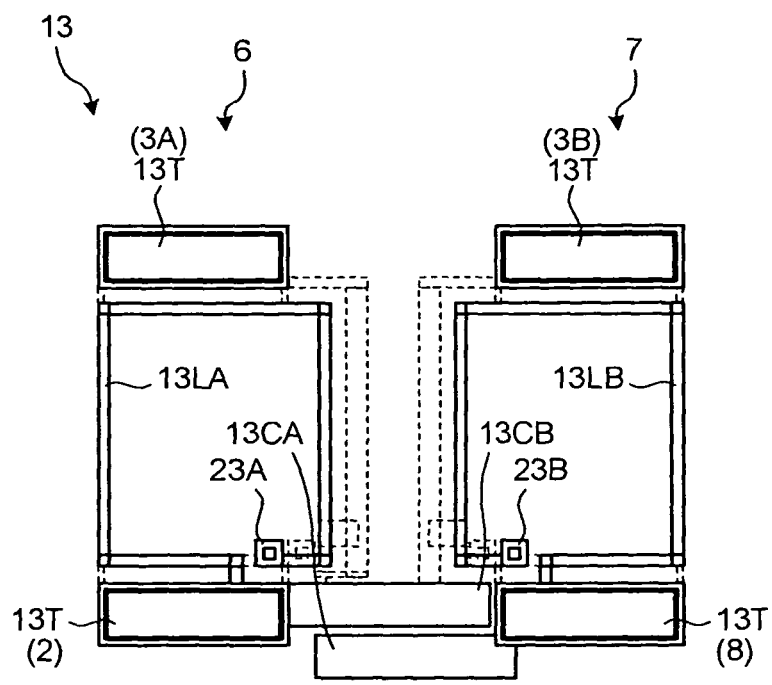
FIG. 3A is a plane view illustrating each conductor layer of the balun in the first embodiment.

FIG. 3A to FIG. 3E are plane views illustrating each conductor layer of the balun in the first embodiment. As illustrated in FIG. 3A, the first conductor layer 13 has the first coil conductor 13LA, the second coil conductor 13LB, the first capacitor substrate-side electrode 13CA, the second capacitor substrate-side electrode 13CB, and the terminal conductors 13T to be the unbalanced terminal 2, the first balanced terminal 3A, the second balanced terminal 3B, and the ground terminal 8. The first coil conductor 13LA and the first capacitor substrate-side electrode 13CA constitute one part of the low pass filter 6, and the second coil conductor 13LB and the second capacitor substrate-side electrode 13CB constitute one part of the high pass filter 7. In relation to the first coil conductor 13LA and the second coil conductor 13LB in the first conductor layer 13, the width or the number of winds is not limited, and can be the same or different between the two coil conductors 13LA and 13LB. In the first conductor layer 13, the first capacitor substrate-side electrode 13CA and the second capacitor substrate-side electrode 13CB are arranged in different areas from the first coil conductor 13LA and the second coil conductor 13LB.

The first coil conductor 13LA on the side of the low pass filter 6 is connected to the unbalanced terminal 2 and the via 23A. The second coil conductor 13LB on the side of the high pass filter 7 is connected to the ground terminal 8 and the via 23B. The first capacitor substrate-side electrode 13CA on the side of the low pass filter 6 is connected to the ground terminal 8, and the second capacitor substrate-side electrode 13CB on the side of the high pass filter 7 is connected to the unbalanced terminal 2. The unbalanced terminal 2, the first balanced terminal 3A, the second balanced terminal 3B, and the ground terminal 8 are connected at the terminal conductors 13T, 17T, 19T, and 21T that are illustrated in FIG. 3B to FIG. 3E, respectively and they are arranged in the same manner in each conductor layer.

Figure 3B:
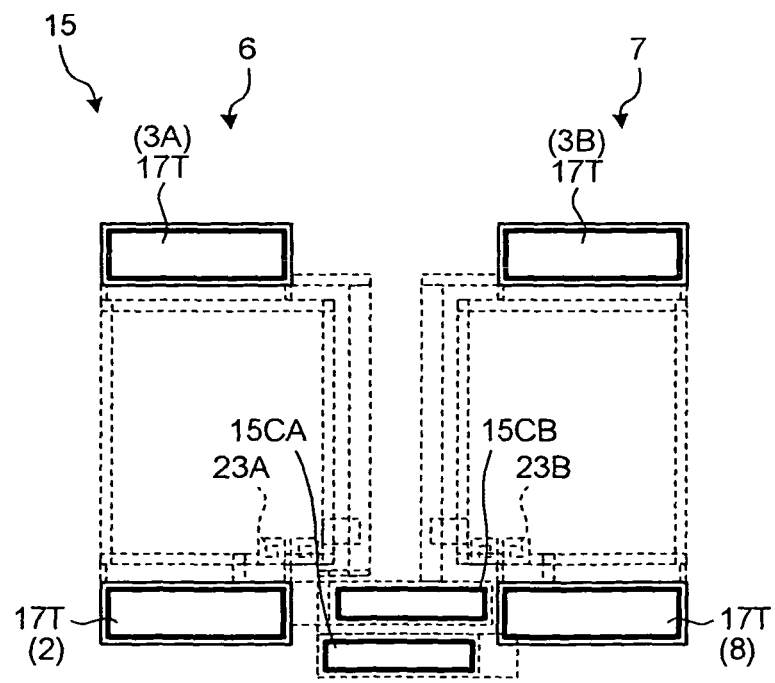
FIG. 3B is a plane view illustrating each conductor layer of the balun in the first embodiment.
Figure 3C:
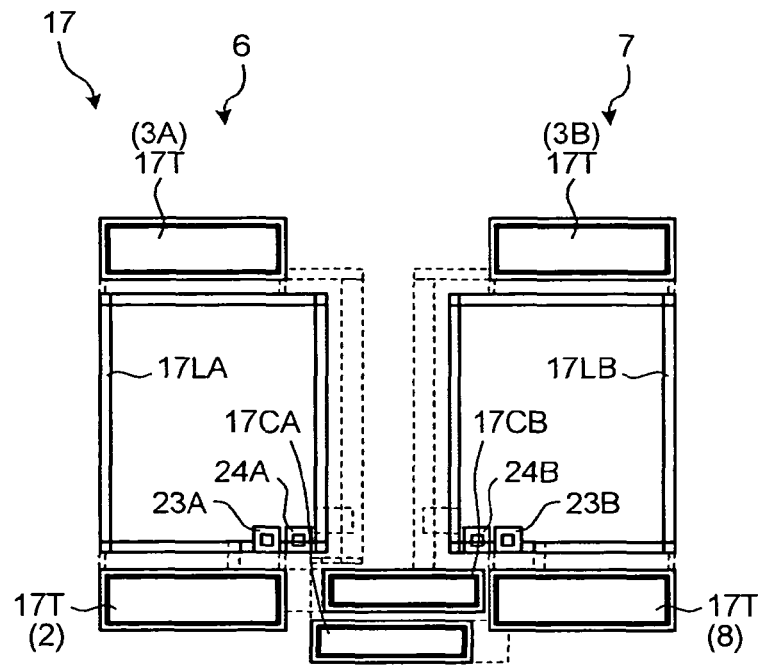
FIG. 3C is a plane view illustrating each conductor layer of the balun in the first embodiment.

As illustrated in FIG. 3B, the intermediate conductor layer 15 has, between the unbalanced terminal 2 and the ground terminal 8, the first capacitor opposite electrode 15CA on the side of the low pass filter 6, the second capacitor opposite electrode 15CB on the side of the high pass filter 7, and the terminal conductors 17T. As illustrated in FIG. 3C, the second conductor layer 17 has the first coil conductor 17LA, the second coil conductor 17LB, the first capacitor electrode 17CA, the second capacitor electrode 17CB, and the terminal conductors 17T. The first coil conductor 17LA is connected to the first coil conductor 13LA of the first conductor layer 13 through the via 23A. The second coil conductor 17LB is connected to the second coil conductor 13LB of the first conductor layer 13 through the via 23B. The first coil conductor 17LA is connected to the via 24A, and the second coil conductor 17LB is connected to the via 24B. Also in the second conductor layer 17, in relation to the first coil conductor 17LA and the second coil conductor 17LB, the width or the number of winds is not limited, and can be the same or different between the two coil conductors 17LA and 17LB. In the second conductor layer 17, the first capacitor electrode 17CA and the second capacitor electrode 17CB are arranged in different areas from the first coil conductor 17LA and the second coil conductor 17LB.

Figure 3D:
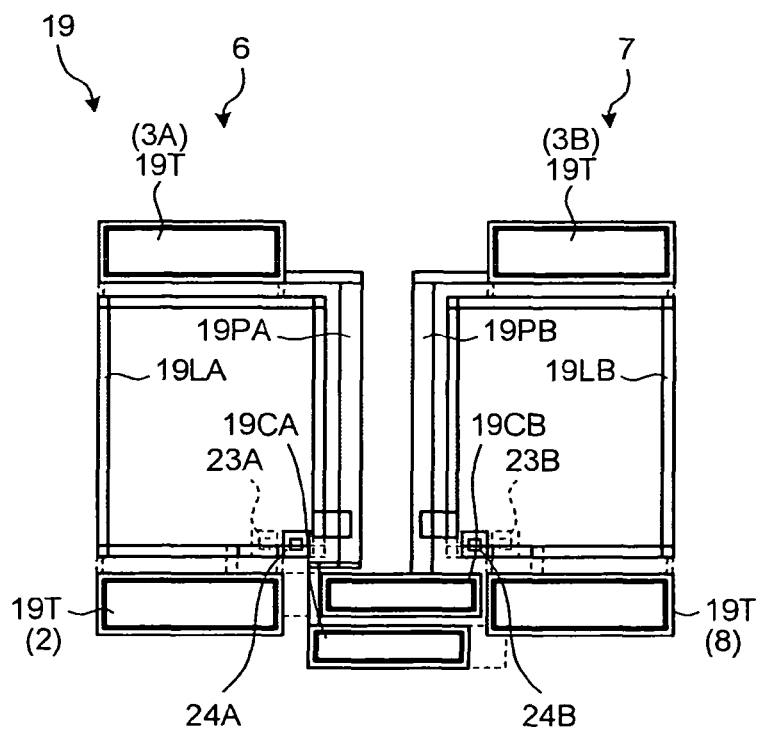
FIG. 3D is a plane view illustrating each conductor layer of the balun in the first embodiment.

As illustrated in FIG. 3D, the third conductor layer 19 has the first coil conductor 19LA, the second coil conductor 19LB, the first capacitor electrode 19CA, the second capacitor electrode 19CB, and the terminal conductors 19T. The first coil conductor 19LA is connected to the first coil conductor 17LA of the second conductor layer 17 through the via 24A. The second coil conductor 19LB is connected to the second coil conductor 17LB of the second conductor layer 17 through the via 24B. The first capacitor electrode 19CA is connected to the first capacitor electrode 17CA of the second conductor layer 17 through the via 25A illustrated in FIG. 2, and the second capacitor electrode 19CB is connected to the second capacitor electrode 17CB of the second conductor layer 17 through the via 25B illustrated in FIG. 2.

Figure 3E:
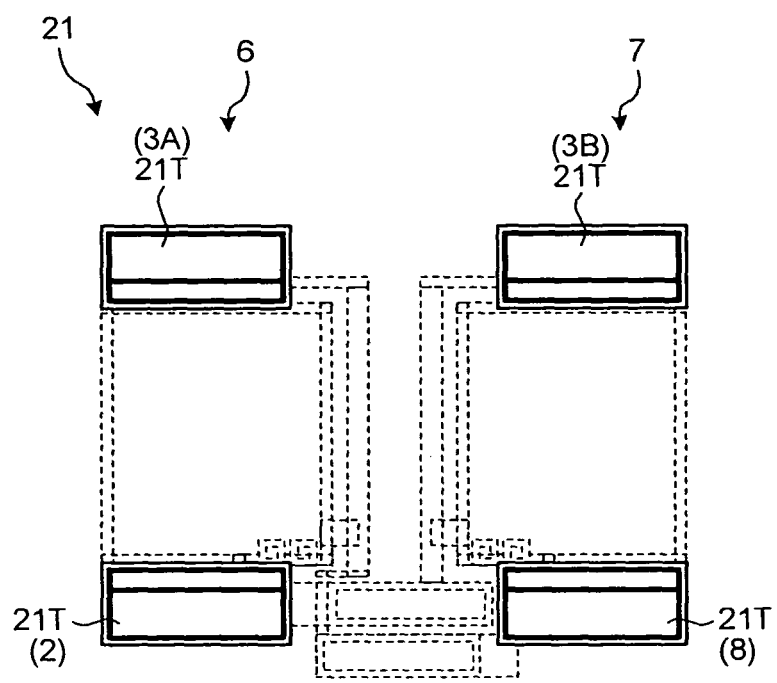
FIG. 3E is a plane view illustrating each conductor layer of the balun in the first embodiment.

The terminal conductor 19T to be the first balanced terminal 3A and the first capacitor electrode 19CA on the side of the low pass filter 6 are connected to each other through wiring 19PA. The first coil conductor 19LA on the side of the low pass filter 6 is connected to the wiring 19PA. The terminal conductor 19T to be the second balanced terminal 3B and the second capacitor electrode 19CB on the side of the high pass filter 7 are connected to each other through wiring 19PB. The second coil conductor 19LB on the side of the high pass filter 7 is connected to the wiring 19PB. Also in the third conductor layer 19, in relation to the first coil conductor 19LA and the second coil conductor 19LB, the width or the number of winds is not limited, and can be the same or different between the two coil conductors 19LA and 19LB. In the third conductor layer 19, the first coil 4A of the low pass filter 6 and the second coil 4B of the high pass filter 7 are completed. Then, as illustrated in FIG. 3E, in the fourth conductor layer 21, the terminal conductors 21T become external connection terminals, so that the balun 1 constituting the equivalent circuit illustrated in FIG. 1 is completed.

With such a structure, in the balun 1, the first capacitor 5A and the second capacitor 5B are arranged in different areas from the first coil 4A and the second coil 4B when viewed from a laminated direction. Therefore, the influence of the first capacitor 5A and the second capacitor 5B on magnetic fields generated by the first coil 4A and the second coil 4B can be reduced. In the balun 1, the first capacitor 5A and the second capacitor 5B are arranged in the same area as the first coil 4A and the second coil 4B in a laminated direction. Thus, the low profile (reduction in size in a laminated direction) of the balun 1 can be realized. Consequently, the electrical properties of the balun 1 are improved. Next, an example of the method of producing the balun 1 is described.

Figure 4A:
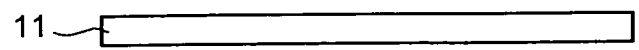
FIG. 4A is a diagram illustrating an example of a method for producing the balun in the first embodiment.
Figure 4B:
FIG. 4B is a diagram illustrating an example of the method for producing the balun in the first embodiment.
Figure 4C:
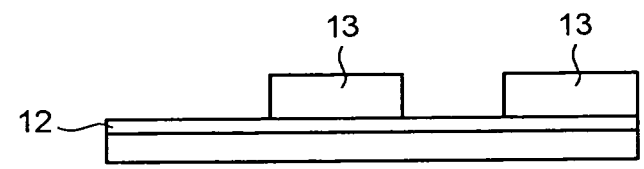
FIG. 4C is a diagram illustrating an example of the method for producing the balun in the first embodiment.
Figure 4D:
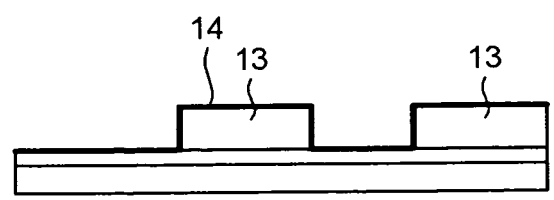
FIG. 4D is a diagram illustrating an example of the method for producing the balun in the first embodiment.

FIG. 4A to FIG. 4M are diagrams illustrating an example of the method of producing the balun in the first embodiment. First, as illustrated in FIG. 4A, the substrate 11 is prepared. Next, as illustrated in FIG. 4B, the smooth layer 12 is formed on the surface of the substrate 11. Then, as illustrated in FIG. 4C, the first conductor layers 13 are formed on the surface of the substrate 11, more concretely on the surface of the smooth layer 12. The first conductor layers 13 can be formed of copper (Cu) plating, for example. Subsequently, as illustrated in FIG. 4D, the dielectric layer 14 determining the capacity of the first capacitor 5A and the second capacitor 5B is formed. The dielectric layer 14 is formed in a manner that silicon nitride (SiN) is deposited by chemical vapor deposition (CVD), for example.

Figure 4E:
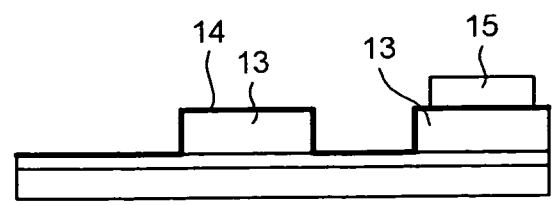
FIG. 4E is a diagram illustrating an example of the method for producing the balun in the first embodiment.
Figure 4F:
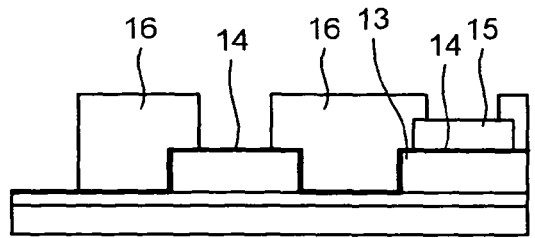
FIG. 4F is a diagram illustrating an example of the method for producing the balun in the first embodiment.

Next, as illustrated in FIG. 4E, the intermediate conductor layer 15 is formed on a position that is on the surface of the dielectric layer 14 and corresponds to the first conductor layer 13 as a part constituting the first capacitor 5A and the second capacitor 5B. The intermediate conductor layer 15 can be formed of copper (Cu) plating, for example. In this way, the first conductor layer 13, the dielectric layer 14, and the intermediate conductor layer 15 constitute the first capacitor 5A and the second capacitor 5B. Then, as illustrated in FIG. 4F, the first insulating layers 16 are formed on the surface of the dielectric layer 14. The first insulating layer 16 is formed in a manner that polyimide is disposed at necessary points on the surface of the dielectric layer 14 by photolithography, for example.

Figure 4G:
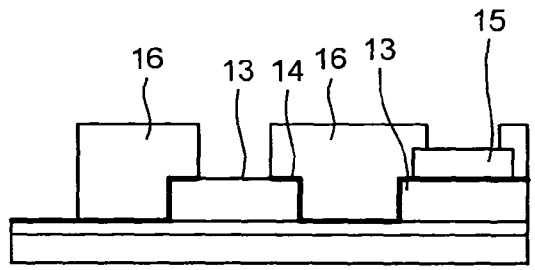
FIG. 4G is a diagram illustrating an example of the method for producing the balun in the first embodiment.
Figure 4H:
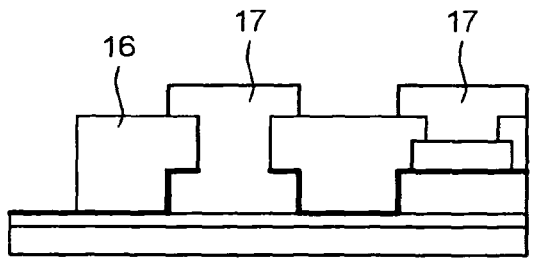
FIG. 4H is a diagram illustrating an example of the method for producing the balun in the first embodiment.

Next, as illustrated in FIG. 4G, the dielectric layer (SiN film) on connecting portions in the first coil 4A and the second coil 4B, formed by connection between the first conductor layer 13 and the second conductor layer 17, and on portions to be the unbalanced terminal 2, the first balanced terminal 3A, the second balanced terminal 3B, and the ground terminal 8, is removed in through-hole steps. Then, as illustrated in FIG. 4H, the second conductor layers 17 are formed on the surfaces of the first insulating layers 16. The second conductor layer 17 is formed of copper (Cu) plating, for example.

Figure 4I:
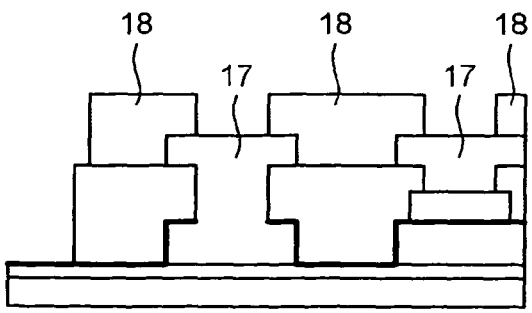
FIG. 4I is a diagram illustrating an example of the method for producing the balun in the first embodiment.
Figure 4J:
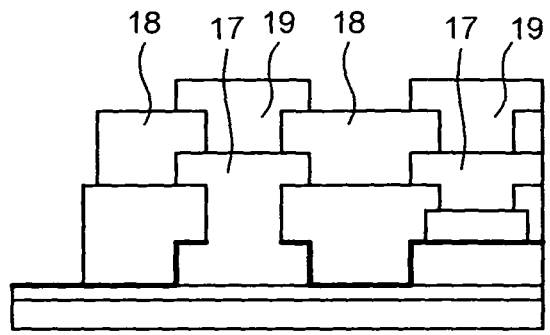
FIG. 4J is a diagram illustrating an example of the method for producing the balun in the first embodiment.
Figure 4K:
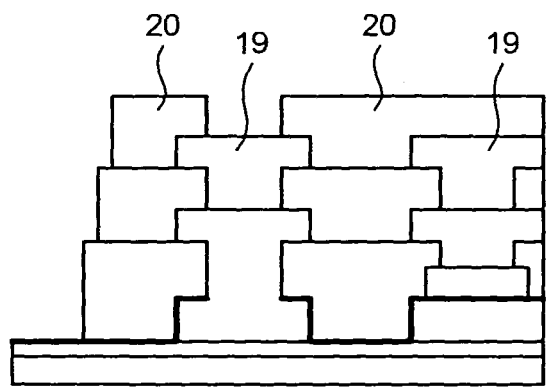
FIG. 4K is a diagram illustrating an example of the method for producing the balun in the first embodiment.
Figure 4L:
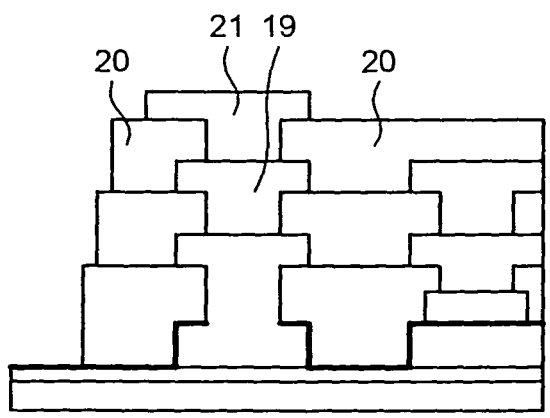
FIG. 4L is a diagram illustrating an example of the method for producing the balun in the first embodiment.
Figure 4M:
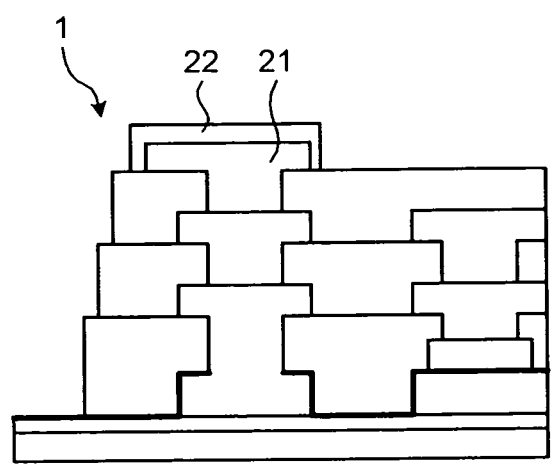
FIG. 4M is a diagram illustrating an example of the method for producing the balun in the first embodiment.

Subsequently, as illustrated in FIG. 4I, the second insulating layers 18 are formed on the surface of the second conductor layers 17. The second insulating layer 18 is formed in a manner that polyimide is disposed at necessary points on the surface of the second conductor layer 17 by photolithography, for example. Then, as illustrated in FIG. 4J, the third conductor layers 19 are formed on the surfaces of the second insulating layers 18. The third conductor layer 19 is formed of copper (Cu) plating, for example. Next, as illustrated in FIG. 4K, the third insulating layers (overcoat) 20 are formed on the surfaces of the third conductor layers 19. The third insulating layer 20 is formed of polyimide, for example. Subsequently, as illustrated in FIG. 4L, the fourth conductor layer 21 to be the unbalanced terminal 2, the first balanced terminal 3A, the second balanced terminal 3B, and the ground terminal 8 is formed. The fourth conductor layer 21 is formed of copper (Cu) plating, for example. Finally, as illustrated in FIG. 4M, the surface of the fourth conductor layer 21 is covered with the terminal plating layer 22, so that the balun 1 is completed. The terminal plating layer 22 can be formed by nickel (Ni)

gold (Au) electroless plating. Note that the method of producing the balun 1 and the material of the balun 1 are not limited to the above (the same is applied to the following examples).

First Modified Example of Laminated Structure

Figure 5:
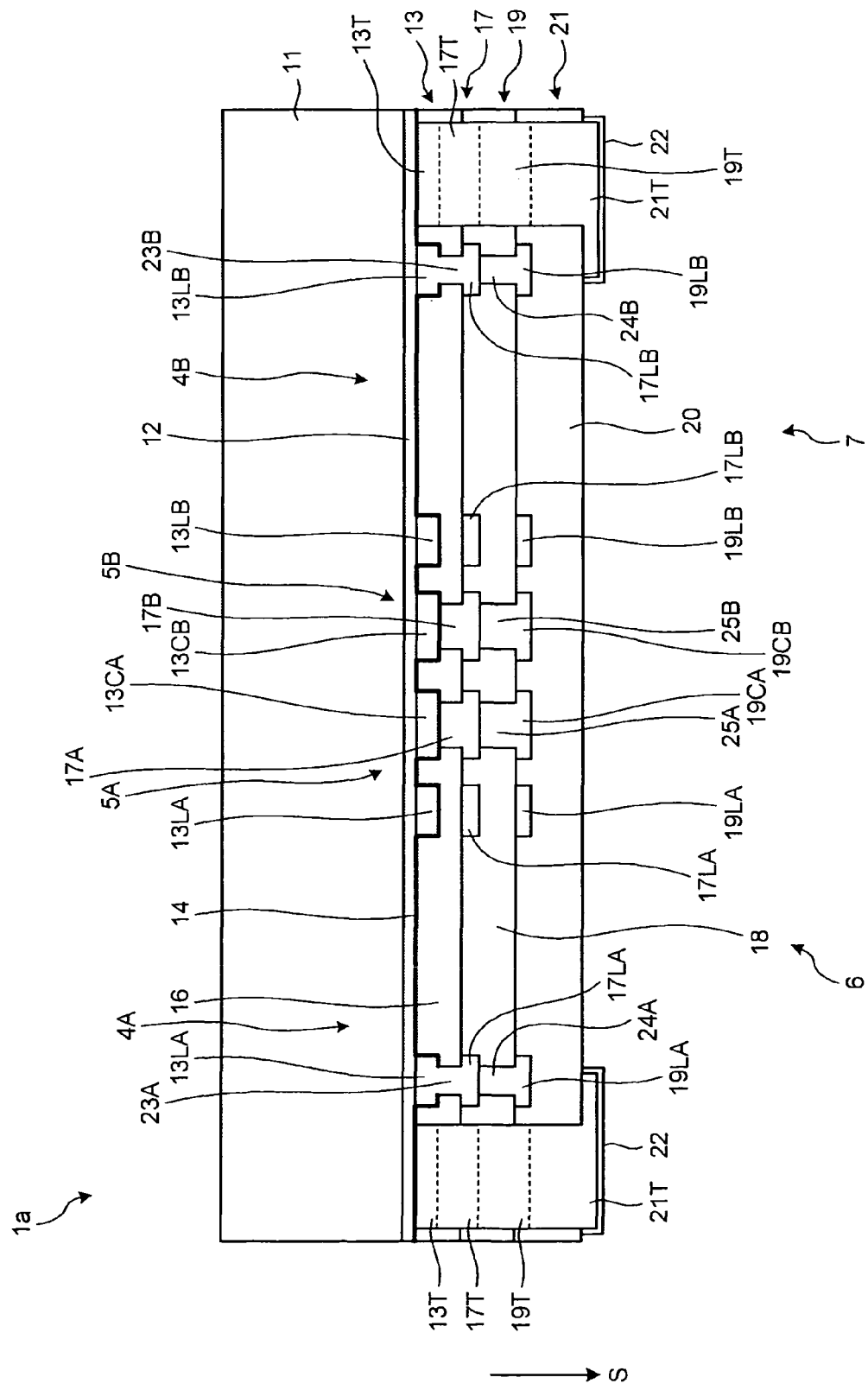
FIG. 5 is a cross-sectional view of a first modified example of the laminated structure of the balun in the first embodiment.

FIG. 5 is a cross-sectional view of a first modified example of the laminated structure of the balun in the first embodiment. A balun 1a illustrated in FIG. 5 is different in that it does not have the intermediate conductor layer 15 (see FIG. 2) that the balun 1 of the first embodiment has, and that the first capacitor opposite electrode 15CA and the first capacitor electrode 17CA of the balun 1 are constituted by a first capacitor common electrode 17A, and the second capacitor opposite electrode 15CB and the second capacitor electrode 17CB of the balun 1 are constituted by a second capacitor common electrode 17B. In the balun 1, the first capacitor opposite electrode 15CA and the second capacitor opposite electrode 15CB are formed and then, on the respective surfaces, the first capacitor electrode 17CA and the second capacitor electrode 17CB are formed. In the balun 1a, as described later, the first capacitor common electrode 17A and the second capacitor common electrode 17B are formed in a single process. The first capacitor common electrode 17A and the second capacitor common electrode 17B have functions of the first capacitor opposite electrode 15CA and the first capacitor electrode 17CA of the balun 1, and the second capacitor opposite electrode 15CB and the second capacitor electrode 17CB thereof, respectively.

The first coil 4A on the side of the low pass filter 6 is constituted by the first coil conductor 13LA, the second coil conductor 17LA, the third coil conductor 19LA, the via 23A, the via 24A, the first insulating layer 16, the second insulating layer 18, and the third insulating layer 20 that are on the side of the low pass filter 6. The second coil 4B on the side of the high pass filter 7 is constituted by the second coil conductor 13LB, the second coil conductor 17LB, the third coil conductor 19LB, the via 23B, the via 24B, the first insulating layer 16, the second insulating layer 18, and the third insulating layer 20 that are on the side of the high pass filter 7. The first capacitor 5A on the side of the low pass filter 6 has the first capacitor substrate-side electrode 13CA, the dielectric layer 14, and the first capacitor common electrode 17A. The second capacitor 5B on the side of the high pass filter 7 has the second capacitor substrate-side electrode 13CB, the dielectric layer 14, and the second capacitor common electrode 17B. The terminal portion is constituted by the terminal conductors 13T, 17T, 19T, and 21T, and the terminal plating layer 22. Next, an example of the method of producing the balun 1a is described.

Figure 6A:
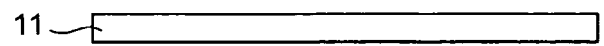
FIG. 6A is a diagram illustrating an example of a method for producing the balun in the first modified example.
Figure 6B:
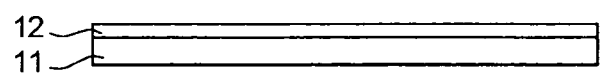
FIG. 6B is a diagram illustrating an example of the method for producing the balun in the first modified example.
Figure 6C:
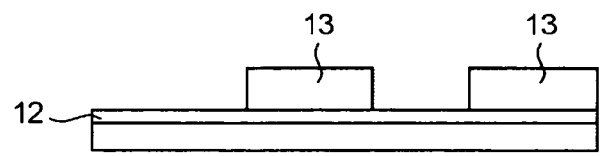
FIG. 6C is a diagram illustrating an example of the method for producing the balun in the first modified example.
Figure 6D:
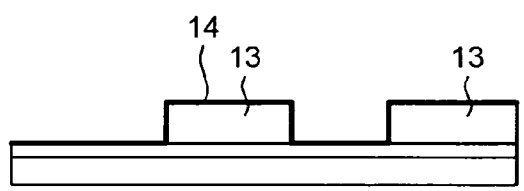
FIG. 6D is a diagram illustrating an example of the method for producing the balun in the first modified example.
Figure 6E:
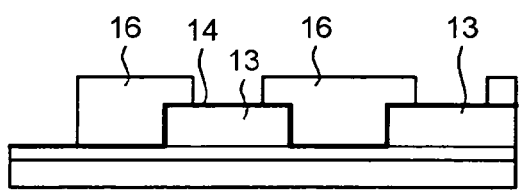
FIG. 6E is a diagram illustrating an example of the method for producing the balun in the first modified example.
Figure 6F:
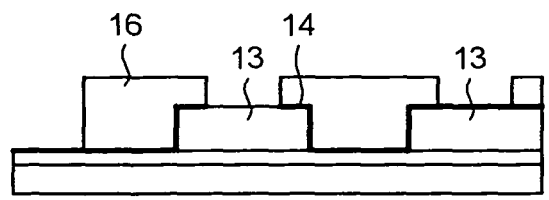
FIG. 6F is a diagram illustrating an example of the method for producing the balun in the first modified example.
Figure 6G:
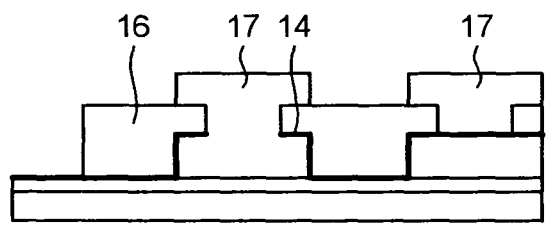
FIG. 6G is a diagram illustrating an example of the method for producing the balun in the first modified example.
Figure 6H:
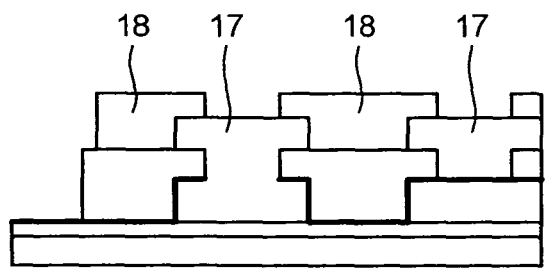
FIG. 6H is a diagram illustrating an example of the method for producing the balun in the first modified example.
Figure 6I:
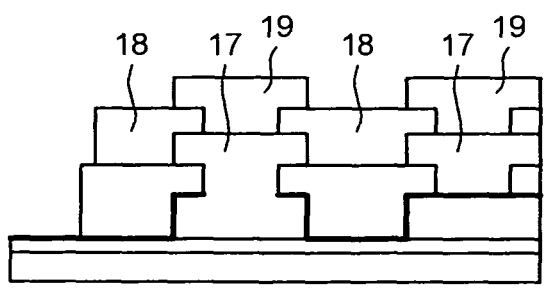
FIG. 6I is a diagram illustrating an example of the method for producing the balun in the first modified example.
Figure 6J:
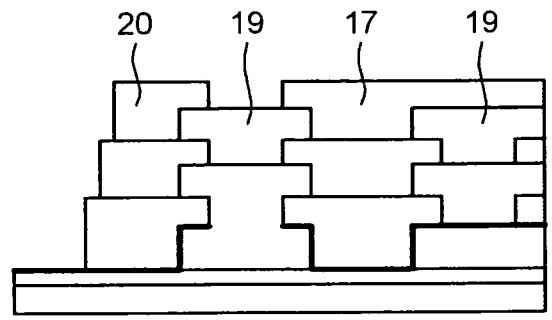
FIG. 6J is a diagram illustrating an example of the method for producing the balun in the first modified example.
Figure 6K:
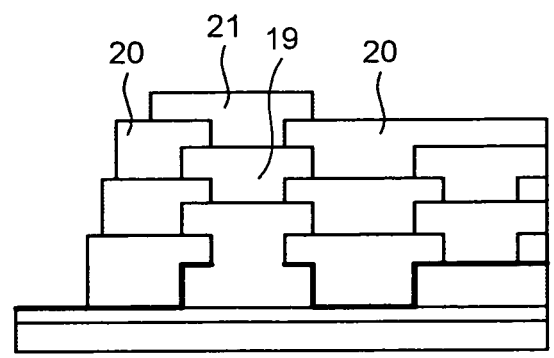
FIG. 6K is a diagram illustrating an example of the method for producing the balun in the first modified example.
Figure 6L:
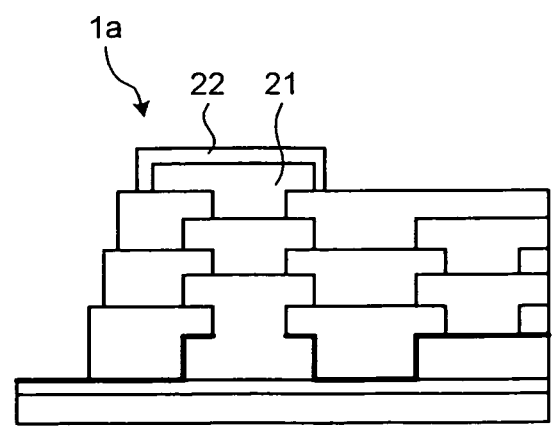
FIG. 6L is a diagram illustrating an example of the method for producing the balun in the first modified example.

FIG. 6-A to FIG. 6L are diagrams illustrating an example of the method of producing the balun in the first modified example. The procedure until the formation of the dielectric layer 14 as illustrated in FIG. 6D is the same as in the method of producing the balun in the first embodiment, and thus the explanation thereof is omitted. After the dielectric layer 14 is formed, as illustrated in FIG. 6E, the first insulating layers 16 are formed on the surface of the dielectric layer 14 but except the positions of the surface corresponding to the first conductor layer 13 as a part constituting the first capacitor 5A and the second capacitor 5B and the positions corresponding to the first conductor layer 13 as a part constituting the unbalanced terminal 2, the first balanced terminal 3A, the second balanced terminal 3B, and the ground terminal 8. The first insulating layers 16 are formed in a manner that polyimide is disposed at necessary points on the surface of the dielectric layer 14 by photolithography, for example.

Next, as illustrated in FIG. 6F, the dielectric layer 14 on connecting portions in the first coil 4A and the second coil 4B, formed by connection between the first conductor layer 13 and the second conductor layer 17, and on portions to be the unbalanced terminal 2, the first balanced terminal 3A, the second balanced terminal 3B, and the ground terminal 8, is removed in through-hole steps. Then, as illustrated in FIG. 6G, the second conductor layers 17 are formed on the surface of the first insulating layers 16 and the surface of the first conductor layers 13 opening on the dielectric layer 14. The second conductor layers 17 become the first capacitor common electrode 17A and the second capacitor common electrode 17B illustrated in FIG. 5. Subsequently, as illustrated in FIG. 6H, the second insulating layers 18 are formed on the surfaces of the second conductor layers 17. Then, each of procedures illustrated in FIG. 6I to FIG. 6L is performed. These procedures are the same as in FIG. 4J to FIG. 4M.

In the method of producing the balun in the first modified example, the first capacitor common electrode 17A corresponding to the first capacitor opposite electrode 15CA and the first capacitor electrode 17CA of the balun 1 in the first embodiment is formed in a single process illustrated in FIG. 6G in which the second conductor layers 17 are formed. The second capacitor common electrode 17B corresponding to the second capacitor opposite electrode 15CB and the second capacitor electrode 17CB of the balun 1 is formed in the same way. Thus, the method of producing the balun in the first modified example does not require the process in which the intermediate conductor layer 15 is formed in the method of producing the balun in the first embodiment. Therefore, it is possible to reduce steps for producing the balun 1.

Second Modified Example of Laminated Structure

Figure 7:
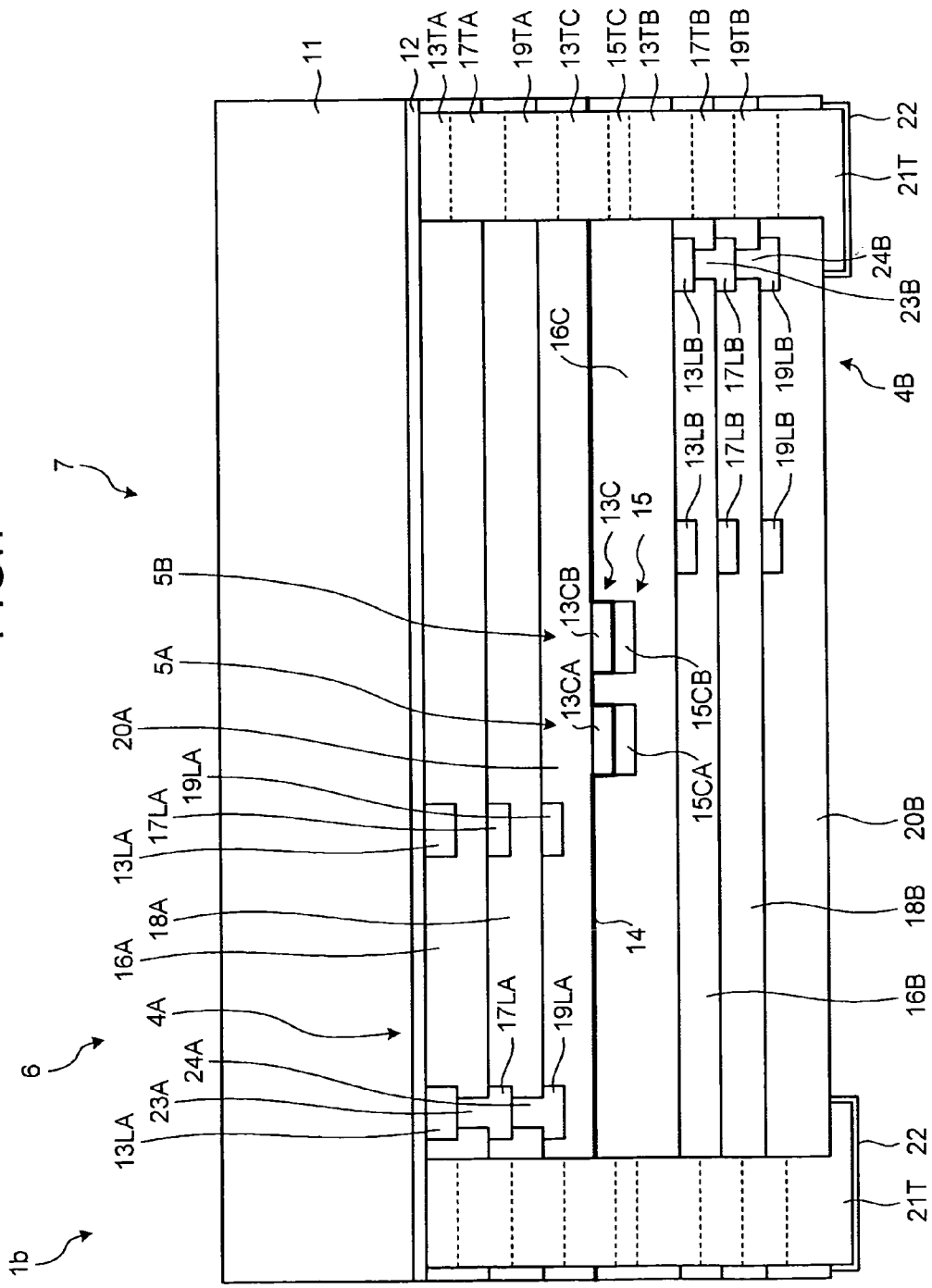
FIG. 7 is a cross-sectional view illustrating a second modified example of the laminated structure of the balun in the first embodiment.

FIG. 7 is a cross-sectional view of a second modified example of the laminated structure of the balun in the first embodiment. In a balun 1b illustrated in FIG. 7, the first coil 4A on the side of the low pass filter 6, the second coil 4B on the side of the high pass filter 7, and the first capacitor 5A on the side of the low pass filter 6 and the second capacitor 5B on the side of the high pass filter 7 are arranged in different areas in a laminated direction. In the balun 1b, the first capacitor 5A on the side of the low pass filter 6 and the second capacitor 5B on the side of the high pass filter 7 are arranged in the same area in a laminated direction. Furthermore, in the balun 1b, the first capacitor 5A and the second capacitor 5B are arranged in areas that are between the first coil 4A on the side of the low pass filter 6 and the second coil 4B on the side of the high pass filter 7 and are different from the areas where these coils 4A and 4B are formed when viewed in a laminated direction.

The first coil 4A on the side of the low pass filter 6 is constituted by the first coil conductor 13LA, the second coil conductor 17LA, the third coil conductor 19LA, the via 23A, and the via 24A that are on the side of the low pass filter 6, and the first insulating layer 16A, the second insulating layer 18A, and the third insulating layer 20A that are on the side of the low pass filter 6. The second coil 4B on the side of the high pass filter 7 is constituted by the second coil conductor 13LB, the second coil conductor 17LB, the third coil conductor 19LB, the via 23B, and the via 24B that are on the side of the high pass filter 7, and the first insulating layer 16B, the second insulating layer 18B, and the third insulating layer 20B that are on the side of the high pass filter 7. The first capacitor 5A on the side of the low pass filter 6 is constituted by the first capacitor substrate-side electrode 13CA, the first capacitor opposite electrode 15CA, and the dielectric layer 14. The second capacitor 5B on the side of the high pass filter 7 is constituted by the second capacitor substrate-side electrode 13CB, the second capacitor opposite electrode 15CB, and the dielectric layer 14. The terminal portion is constituted by terminal conductors 13TA, 17TA, 19TA, 13TC, 15TC, 13TB, 17TB, 19TB, and 21T, and the terminal plating layer 22.

The lamination order of the balun 1b is, on the surface of the smooth layer 12 for filling the concavity and convexity to smooth the surface 11S of the substrate 11, the first coil 4A on the side of the low pass filter 6, the first capacitor 5A on the side of the low pass filter 6, and the second capacitor 5B on the side of the high pass filter 7, and then the second coil 4B on the side of the high pass filter 7. In such a way, the laminated structure in the second modified example is formed.

In the balun 1b, the first capacitor 5A and the second capacitor 5B are arranged in different areas from the first coil 4A and the second coil 4B when viewed from a laminated direction. With such arrangement, as compared with a structure of a conventional technique in which the formation areas of coils and capacitors are overlapped when viewed from a laminated direction, the influence of the first capacitor 5A and the second capacitor 5B on magnetic fields generated by the first coil 4A and the second coil 4B can be reduced. As a result, the balun 1b can be also improved in electrical properties similarly to the balun 1 in the first embodiment. In the balun 1b, the first capacitor 5A and the second capacitor 5B are arranged in the same area in a laminated direction, and in an area that is between the first coil 4A and the second coil 4B and is different from the areas where these coils 4A and 4B are formed in a laminated direction.

Third Modified Example of Laminated Structure

Figure 8:
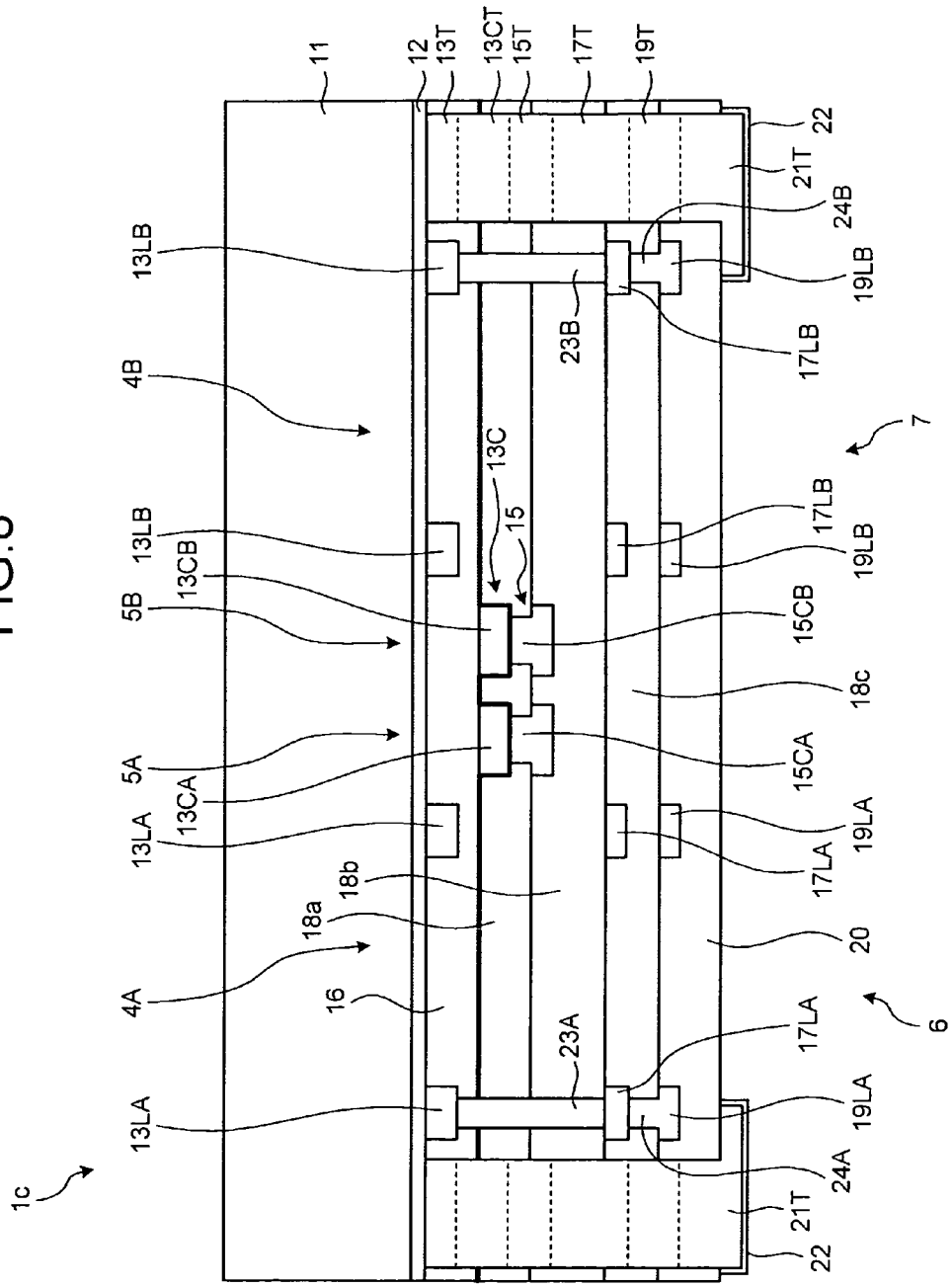
FIG. 8 is a cross-sectional view illustrating a third modified example of the laminated structure of the balun in the first embodiment.

FIG. 8 is a cross-sectional view of a third modified example of the laminated structure of the balun in the first embodiment. In a balun 1C, the first capacitor substrate-side electrode 13CA of the first capacitor 5A and the second capacitor substrate-side electrode 13CB of the second capacitor 5B are formed in a different layer from the first coil conductor 13LA and the second coil conductor 13LB. Thus, in the balun 1C, the first capacitor 5A and the second capacitor 5B are arranged in an area that is the inner side of the first coil 4A and the second coil 4B and is different from the areas where these coils 4A and 4B are formed. That is, in the balun 1c, the first capacitor 5A and the second capacitor 5B are arranged between the first coil 4A and the second coil 4B in a laminated direction. Moreover, in the balun 1c, the first capacitor 5A and the second capacitor 5B are arranged in the same area in a laminated direction. Furthermore, in the balun 1c, the first capacitor 5A and the second capacitor 5B are arranged in different areas from the first coil 4A and the second coil 4B when viewed in a laminated direction. In the balun 1c, the first coil 4A on the side of the low pass filter 6 and the second coil 4B on the side of the high pass filter 7 are arranged in the same area in a laminated direction.

The first coil 4A on the side of the low pass filter 6 is constituted by the first coil conductor 13LA, the second coil conductor 17LA, the third coil conductor 19LA, the via 23A, and the via 24A that are on the side of the low pass filter 6, the first insulating layer 16 on the side of the low pass filter 6, a second insulating layer 18a on the side of the dielectric layer, a second insulating layer 18b between the capacitor and the coil, a second insulating layer 18c on the side of the coil, and the third insulating layer 20. The second coil 4B on the side of the high pass filter 7 is constituted by the second coil conductor 17LB, the second coil conductor 17LB, the third coil conductor 19LB, the via 23B, and the via 24B that are on the side of the high pass filter 7, the first insulating layer 16 on the side of the high pass filter, the second insulating layer 18a on the side of the dielectric layer, the second insulating layer 18b between the capacitor and the coil, the second insulating layer 18c on the side of the coil, and the third insulating layer 20.

The first capacitor 5A on the side of the low pass filter 6 is constituted by the first capacitor substrate-side electrode 13CA, the first capacitor opposite electrode 15CA, and the dielectric layer 14. The second capacitor 5B on the side of the high pass filter 7 is constituted by the second capacitor substrate-side electrode 13CB, the second capacitor opposite electrode 15CB, and the dielectric layer 14. The terminal portion is constituted by the terminal conductors 13T, 13CT, 15T, 17TA, 19T, and 21T, and the terminal plating layer 22. The significant difference from the lamination method in the first embodiment lies in that the lamination size of the via 23A and the via 23B is enlarged so that the first coil 4A on the side of the low pass filter 6 and the second coil 4B on the side of the high pass filter 7 are formed largely in a laminated direction. This structure can be formed by normal photolithography and plating method. In this way, the laminated structure of the third modified example is formed.

In the balun 1c, the first capacitor 5A and the second capacitor 5B are arranged in different areas from the first coil 4A and the second coil 4B when viewed from a laminated direction. With such arrangement, as compared with a structure of a conventional technique in which the formation areas of coils and capacitors are overlapped when viewed from a laminated direction, the influence of the first capacitor 5A and the second capacitor 5B on magnetic fields generated by the first coil 4A and the second coil 4B can be reduced. As a result, the balun 1c can be also improved in electrical properties similarly to the balun 1 in the first embodiment. In the balun 1c, the first capacitor 5A and the second capacitor 5B are arranged in the same area in a laminated direction, and in an area that is the inner side of the first coil 4A and the second coil 4B and is different from the areas where these coils 4A and 4B are formed in a laminated direction.

Fourth Modified Example of Laminated Structure

Figure 9:
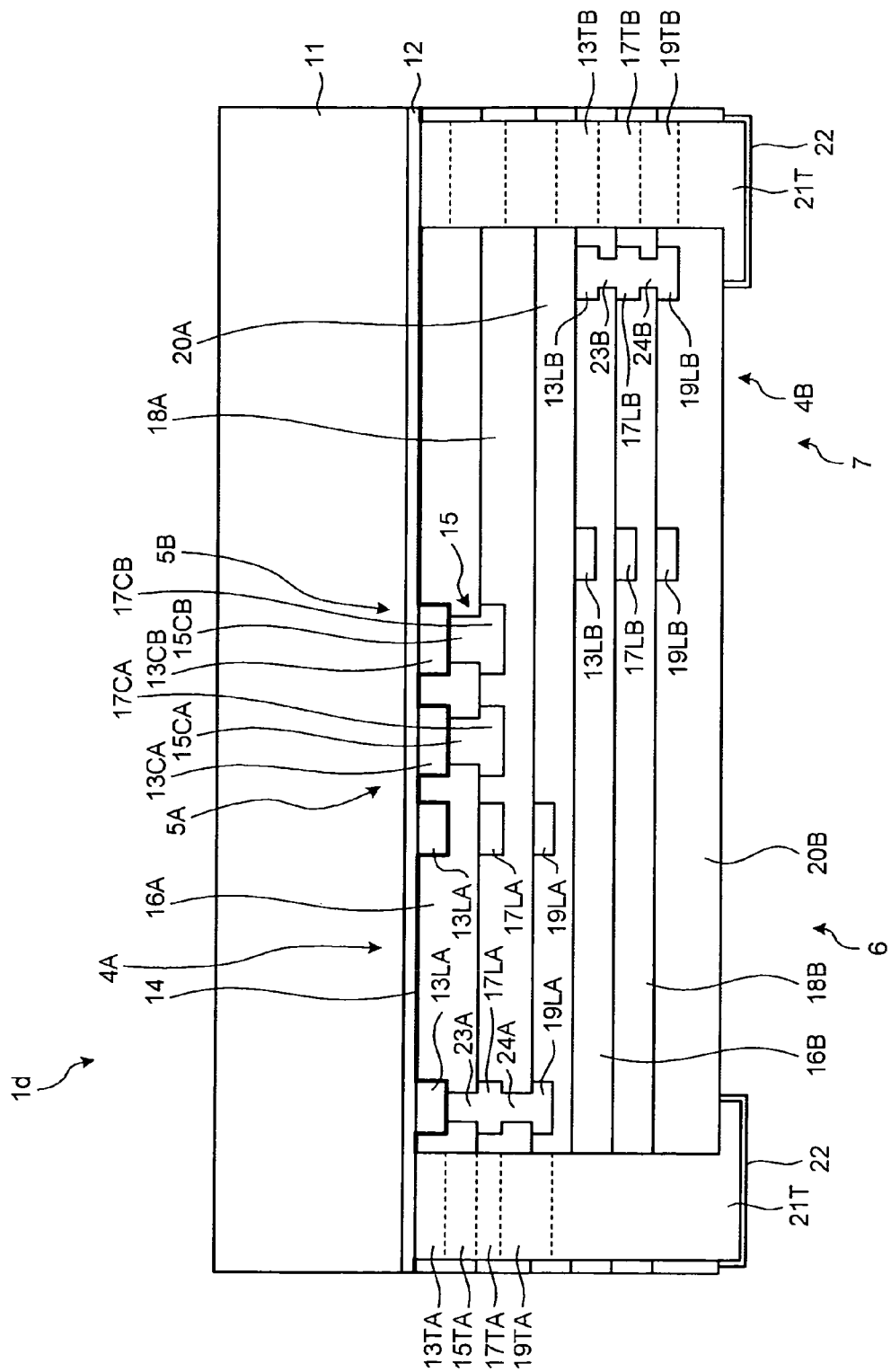
FIG. 9 is a cross-sectional view illustrating a fourth modified example of the laminated structure of the balun in the first embodiment.

FIG. 9 is a cross-sectional view of a fourth modified example of the laminated structure of the balun in the first embodiment. In a balun 1d, the first capacitor 5A and the second capacitor 5B are formed in different areas from the first coil 4A and the second coil 4B when viewed from a laminated direction. In the balun 1d, the first coil 4A on the side of the low pass filter 6, and the first capacitor 5A on the side of the low pass filter 6 and the second capacitor 5B on the side of the high pass filter 7 are arranged in the same area in a laminated direction. Then, only the second coil 4B on the side of the high pass filter 7 is arranged in a different area from the first coil 4A, the first capacitor 5A, and the second capacitor 5B in a laminated direction. In this way, in the balun 1d, the first capacitor 5A and the second capacitor 5B are arranged between the first coil 4A and the second coil 4B in a laminated direction.

In the balun 1d, the first coil 4A on the side of the low pass filter 6 is constituted by the first coil conductor 13LA, the second coil conductor 17LA, the third coil conductor 19LA, and the via 23A, the via 24A that are on the side of the low pass filter 6, and the first insulating layer 16A, the second insulating layer 18A, and the third insulating layer 20A that are on the side of the low pass filter 6. The second coil 4B on the side of the high pass filter 7 is constituted by the second coil conductor 13LB, the second coil conductor 17LB, the third coil conductor 19LB, the via 23B, the via 24B that are on the side of the high pass filter 7, and the first insulating layer 16B, the second insulating layer 18B, and the third insulating layer 20B that are on the side of the high pass filter 7. The first capacitor 5A on the side of the low pass filter 6 is constituted by the first capacitor substrate-side electrode 13CA, the first capacitor opposite electrode 15CA, the first capacitor electrode 17CA, and the dielectric layer 14. The second capacitor 5B on the side of the high pass filter 7 is constituted by the second capacitor substrate-side electrode 13CB, the second capacitor opposite electrode 15CB, the second capacitor electrode 17CB, and the dielectric layer 14. The terminal portion is constituted by the terminal conductors 13TA, 15TA, 17TA, 19TA, 13TB, 17TB, 19TB, and 21T, and the terminal plating layer 22. In this way, the laminated structure of the fourth modified example is formed.

In the balun 1d, the first capacitor 5A and the second capacitor 5B are arranged in different areas from the first coil 4A and the second coil 4B when viewed from a laminated direction. With such arrangement, as compared with a structure of a conventional technique in which the formation areas of coils and capacitors are overlapped when viewed from a laminated direction, the influence of the first capacitor 5A and the second capacitor 5B on magnetic fields generated by the first coil 4A and the second coil 4B can be reduced. As a result, the balun 1d can be also improved in electrical properties similarly to the balun 1 in the first embodiment. In the balun 1d, the first capacitor 5A and the second capacitor 5B are arranged in an area that is the same as the area where the first coil 4A is formed in a laminated direction and is different from the area where the second coil 4B is formed in a laminated direction.

Second Embodiment

FIG. 10 is a plane view of a balun in a second embodiment of the present invention. In a balun 1A in the second embodiment, in a planar view, that is, when viewed from a laminated direction, the first coil 4A, the second coil 4B, the first capacitor 5A, and the second capacitor 5B are arranged differently from in the baluns 1, 1a, etc., in the first embodiment and the modified examples thereof. In the first coil 4A, it is intended to show the positional relation on a plain face among the second coil 4B, the first capacitor 5A, and the second capacitor 5B that are illustrated in FIG. 10. Therefore, the detail of the laminated structure, as illustrated in FIG. 3A to FIG. 3E, is omitted and simplified.

In the balun 1A, the first capacitor 5A on the side of the low pass filter 6 is arranged between the first coil 4A on the side of the low pass filter 6 and the second coil 4B on the side of the high pass filter 7, and the second capacitor 5B on the side of the high pass filter 7 is arranged between the unbalanced terminal 2 and the ground terminal 8.

Third Embodiment

FIG. 11 is a plane view of a balun in a third embodiment of the present invention. The omission of the laminated structure is the same as in the second embodiment. In a balun 1B, the second capacitor 5B on the side of the high pass filter 7 is arranged between the second coil 4B on the side of the high pass filter 7 and the first coil 4A on the side of the low pass filter 6, and the first capacitor 5A on the side of the low pass filter 6 is arranged between the unbalanced terminal 2 and the ground terminal 8.

Fourth Embodiment

Figure 12:
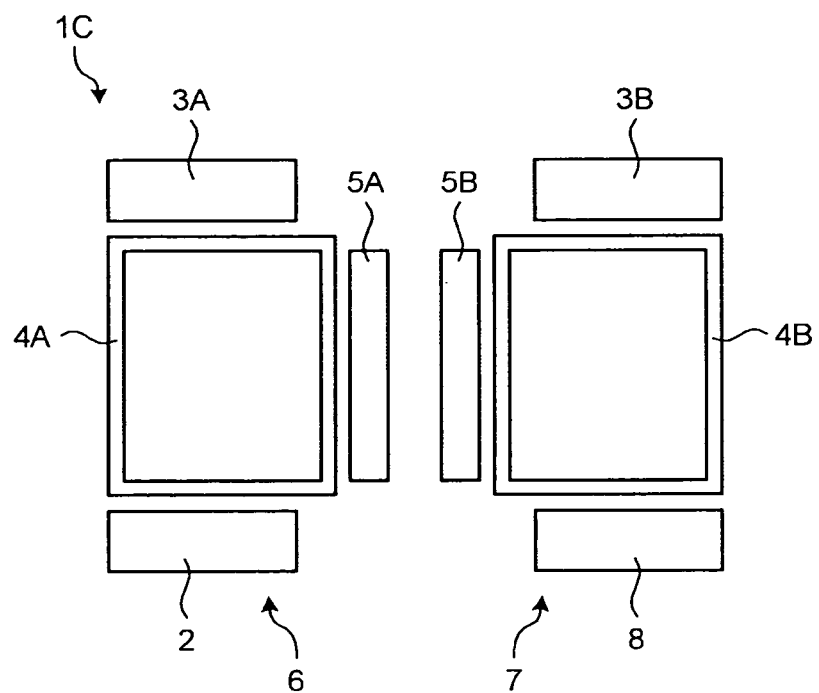
FIG. 12 is a plane view of a balun in a fourth embodiment of the present invention.

FIG. 12 is a plane view of a balun in a fourth embodiment of the present invention. The omission of the laminated structure is the same as in the second and the third embodiments. In a balun 1C, the second capacitor 5B on the side of the high pass filter 7 and the first capacitor 5A on the side of the low pass filter 6 are arranged between the second coil 4B on the side of the high pass filter 7 and the first coil 4A on the side of the low pass filter 6.

Evaluation

The influence of the positional relation of the capacitor 5A on the side of the low pass filter 6 and the capacitor 5B on the side of the high pass filter 7 relative to the first coil 4A on the side of the low pass filter 6 and the second coil 4B on the side of the high pass filter 7 on electrical properties was evaluated. The objects of the evaluation were the baluns 1, 1A, 1B, 1C of the first embodiment to the fourth embodiment, respectively, that are described above, and Comparative Example 1 and Comparative Example 2 that are described later. The balun in the first embodiment corresponds to Example 1, the balun in the second embodiment corresponds to Example 2, the balun in the third embodiment corresponds to Example 3, and the balun in the fourth embodiment corresponds to Example 4.

For the evaluation, computer simulation was used. The 2.5 dimensional simulator SONNET was used as simulation software. The electrical properties were compared among the first embodiment to the fourth embodiment, and Comparative Example 1 and Comparative Example 2 that are described later while changing, in each case, the positional relation of the first capacitor 5A on the side of the low pass filter 6 and the second capacitor 5B on the side of the high pass filter 7 relative to the first coil 4A on the side of the low pass filter 6 and the second coil 4B on the side of the high pass filter 7. For this reason, each coil and each terminal of each conductor layer in Example 1 to Example 4, Comparative Example 1, and Comparative Example 2 were set totally the same in position, arrangement, and shape.

Four properties of insertion loss properties, phase difference properties, amplitude difference properties, and reflection loss properties, which are electrical properties necessary to evaluate the balun, were considered for evaluation. The targeted frequency band was 240 MHz to 2500 MHz, which are used in a wireless-local area network (LAN), Bluetooth, etc. The insertion loss properties represent transmission efficiency, and thus the properties are more preferable when a value of loss is nearer to 0 dB. The phase difference properties are ideal when the phase difference between two balanced signals is 180 deg., and thus the properties are more preferable when the phase difference is nearer to 180 deg. The amplitude difference properties are ideal when the amplitude of two balanced signals is totally the same, and thus the properties are more preferable when the amplitude difference is nearer to 0 dB. The reflection loss properties represent reflection efficiency, and thus the properties are more preferable when a value of dB is larger. In particular, since smaller insertion loss can contribute to electrical power saving, which is demanded in mobile electronic devices, the insertion loss is considered to be the most important electrical properties.

Comparative Example 1

Figure 13:
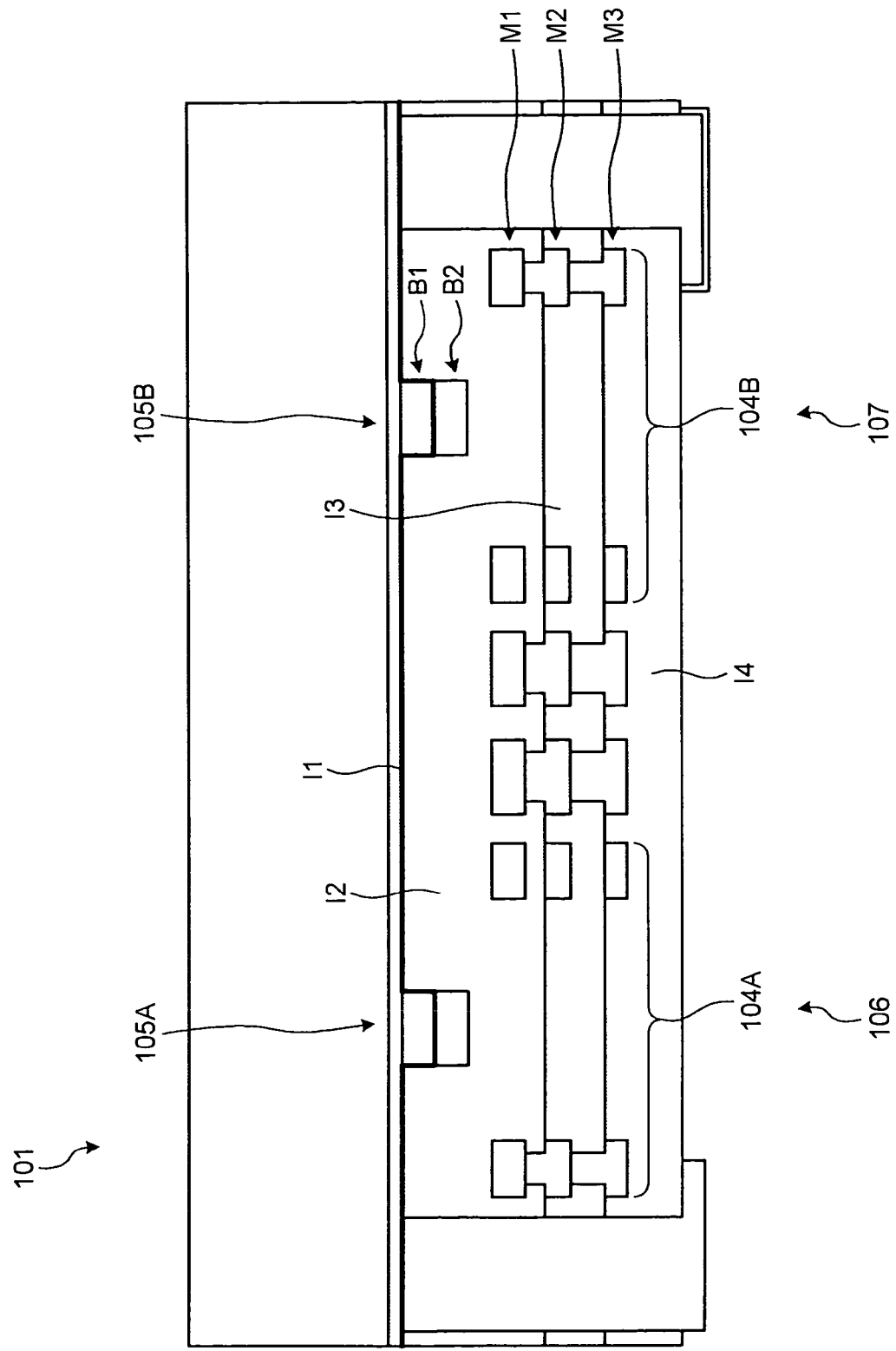
FIG. 13 is a cross-sectional view illustrating a structure of a balun in Comparative Example 1.

FIG. 13 is a cross-sectional view illustrating a structure of a balun in Comparative Example 1. In a balun 101, a first capacitor 105A on the side of a low pass filter 106 and a second capacitor 105B on the side of a high pass filter 107 are arranged so as to overlap the areas where a first coil 104A on the side of the low pass filter 106 and a coil 104B on the side of the high pass filter 107 are arranged when viewed from a laminated direction, more concretely the areas in the coil openings. This derives from a quasi-conventional structure.

In the balun 101, the first coil 104A and the first capacitor 105A constitute the low pass filter 106, and the second coil 104B and the second capacitor 105B constitute the high pass filter 107. The method of producing the balun 101 is the same as the production method in the first embodiment except that the first capacitor 105A and the second capacitor 105B are formed in an area different from the area where the first coil 104A and the second coil 104B are formed in a laminated direction. The first capacitor 105A and the second capacitor 105B are constituted by a conductor layer B1, a conductor layer B2, and an I1 layer of a SiN film that is interposed between the B1 layer and the B2 layer. The first coil 104A and the second coil 105B are constituted by a conductor layer M1, a conductor layer M2, a conductor layer M3, insulating layers I2 and I3 interposed between these conductor layers, and an insulating layer I4 that protects the conductor layer M3 from physical damage from the outside of the product.

Figure 14:
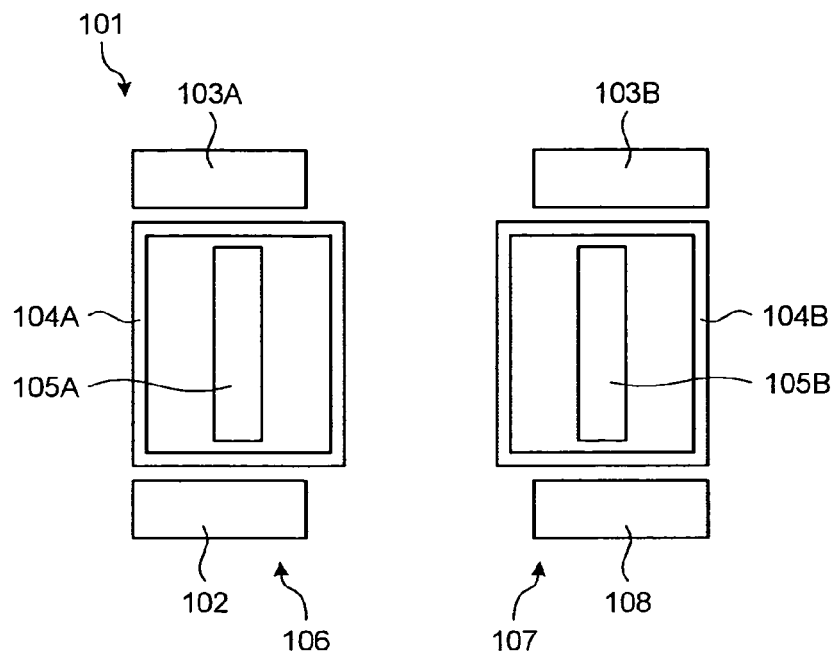
FIG. 14 is a plane view of the balun in Comparative Example 1.

FIG. 14 is a plane view of the balun in Comparative Example 1. The balun 101 has terminals of an unbalanced terminal 102, a first balanced terminal 103A, a second balanced terminal 103B, and a ground terminal 108, a low pass filter 106 having a first coil 104A and a first capacitor 105A, and a high pass filter 107 having a second coil 104B and a second capacitor 105B. Note that, in FIG. 14, it is intended to show the positional relation on a plain face among the first coil 104A, the second coil 104B, the first capacitor 105A, and the second capacitor 105B. Therefore, the detail of the laminated structure, as illustrated in the above-mentioned FIG. 3A to FIG. 3E, is omitted and simplified. The values of the capacity of the first capacitor 105A and the second capacitor 105B are set to be the same as in Example 1 to Example 4. Moreover, it is needed that the thickness of the insulating layer I2 provided for isolation between the conductor layer B2 and the conductor layer M1 is set to be the same as a distance in a planar direction between the first coil 4A and the first capacitor 5A and a distance in a planar direction between the second coil and the second capacitor in Example 1 to Example 4 for comparison. Thus, the thickness of the insulating layer I2 is set to be the same as the distance in a planar direction between the first coil 4A and the first capacitor 5A in a laminated direction.

Comparative Example 2

Figure 15:
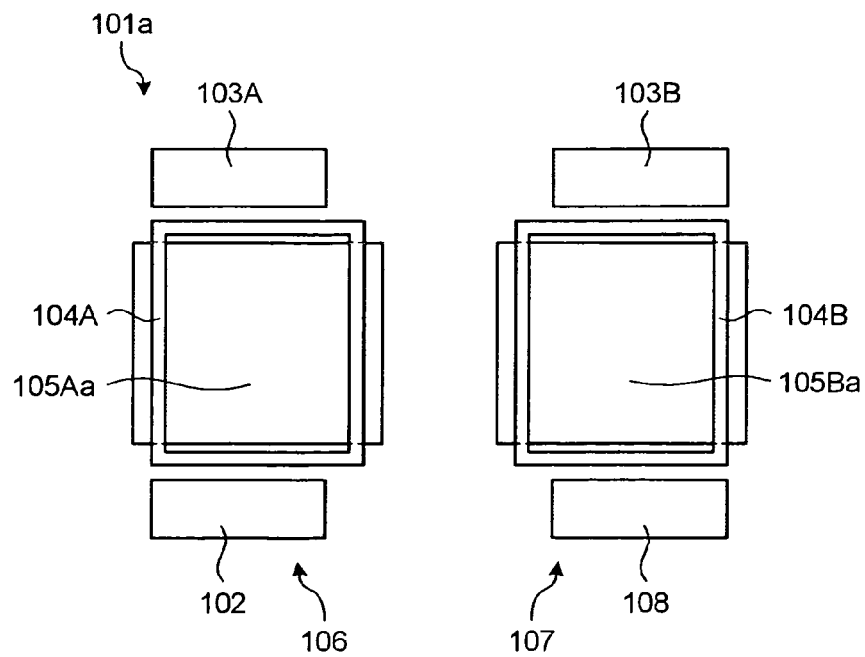
FIG. 15 is a plane view of a balun in Comparative Example 2.
Figure 16A:
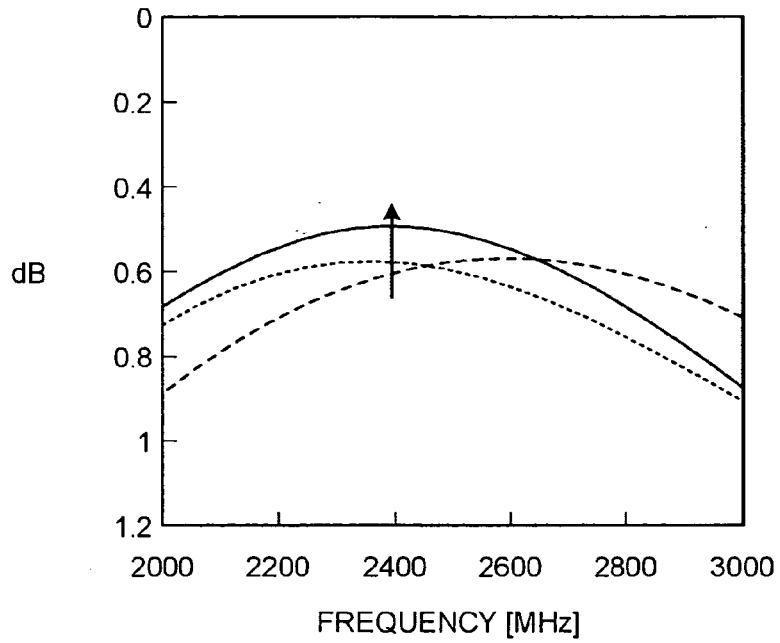
FIG. 16A is a diagram illustrating evaluation results of Example 1, Comparative Example 1, and Comparative Example 2.
Figure 16B:
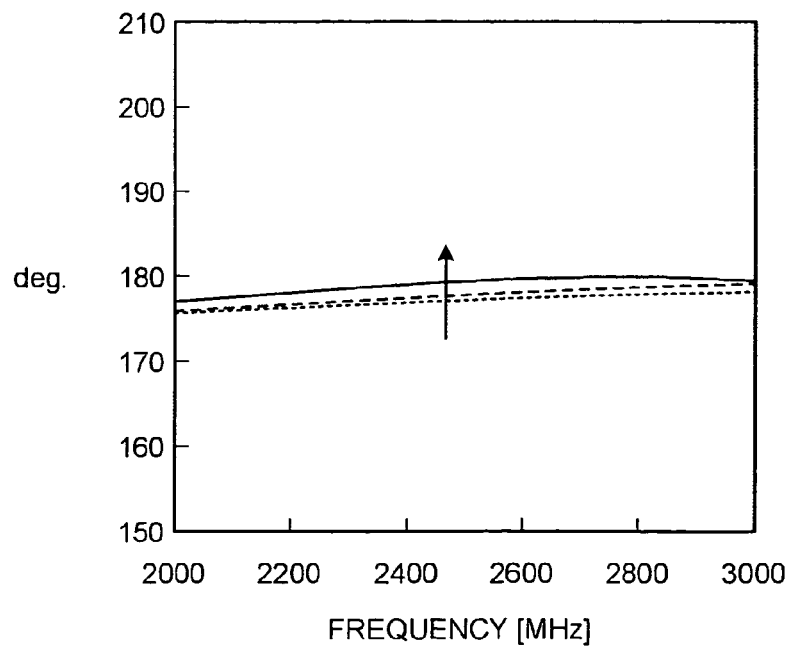
FIG. 16B is a diagram illustrating evaluation results of Example 1, Comparative Example 1, and Comparative Example 2.
Figure 16C:
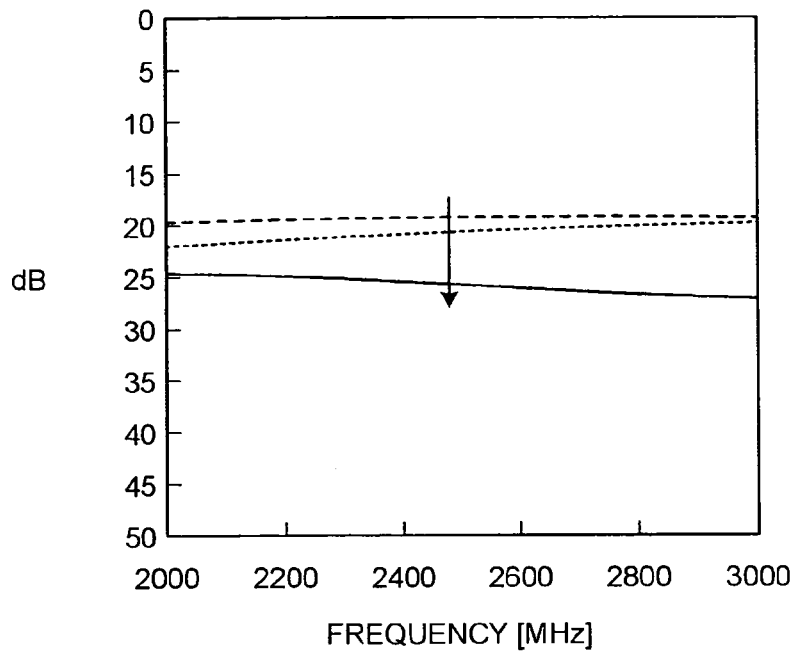
FIG. 16C is a diagram illustrating evaluation results of Example 1, Comparative Example 1, and Comparative Example 2.
Figure 16D:
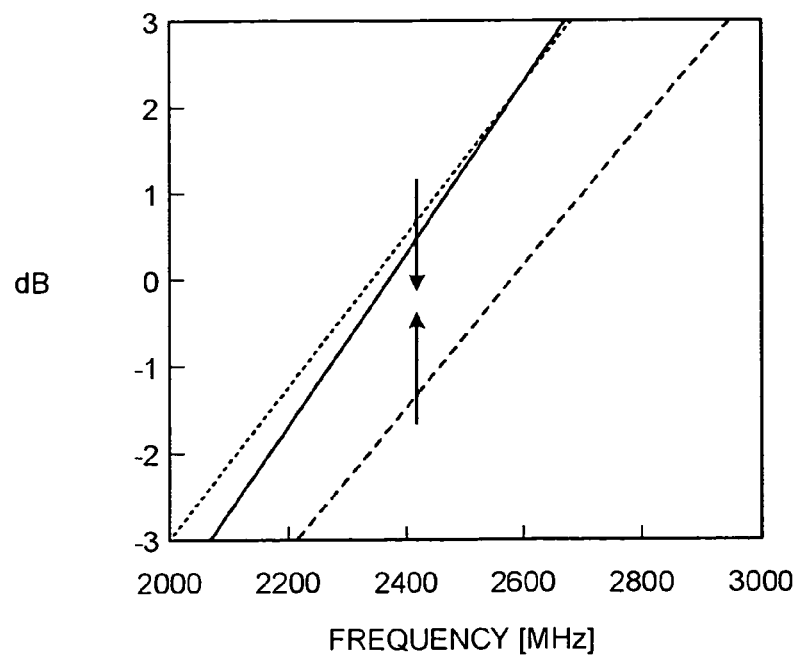
FIG. 16D is a diagram illustrating evaluation results of Example 1, Comparative Example 1, and Comparative Example 2.
Figure 17A:
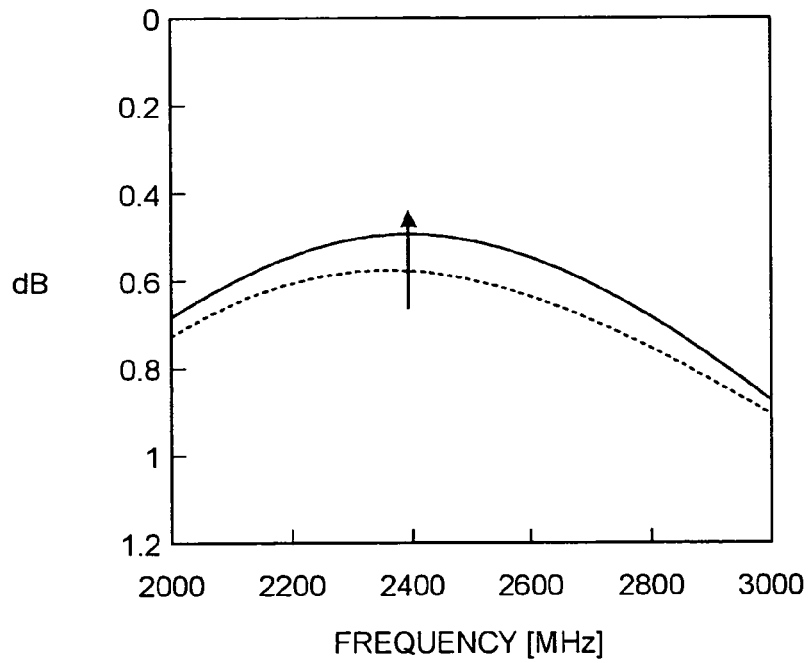
FIG. 17A is a diagram illustrating evaluation results of Example 2 and Comparative Example 1.
Figure 17B:
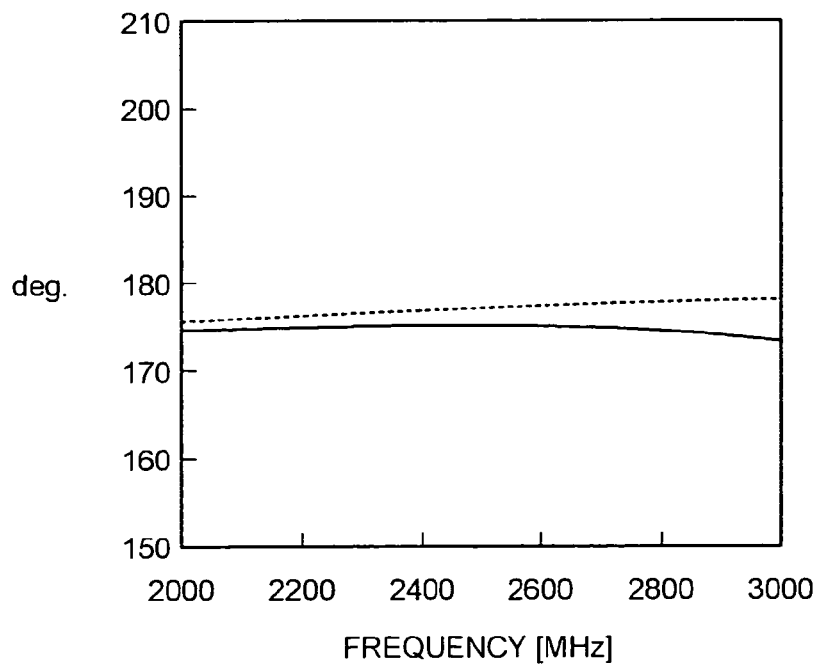
FIG. 17B is a diagram illustrating evaluation results of Example 2 and Comparative Example 1.
Figure 17C:
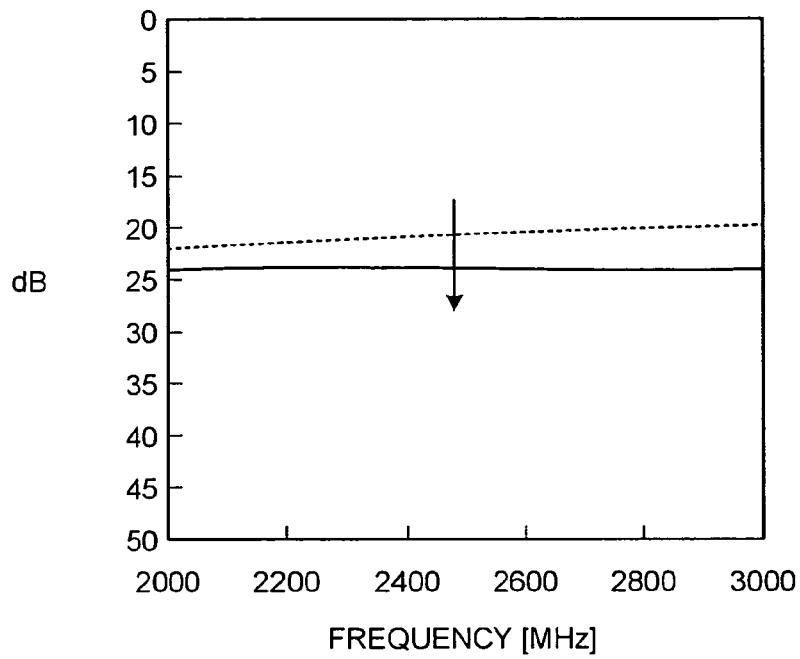
FIG. 17C is a diagram illustrating evaluation results of Example 2 and Comparative Example 1.
Figure 17D:
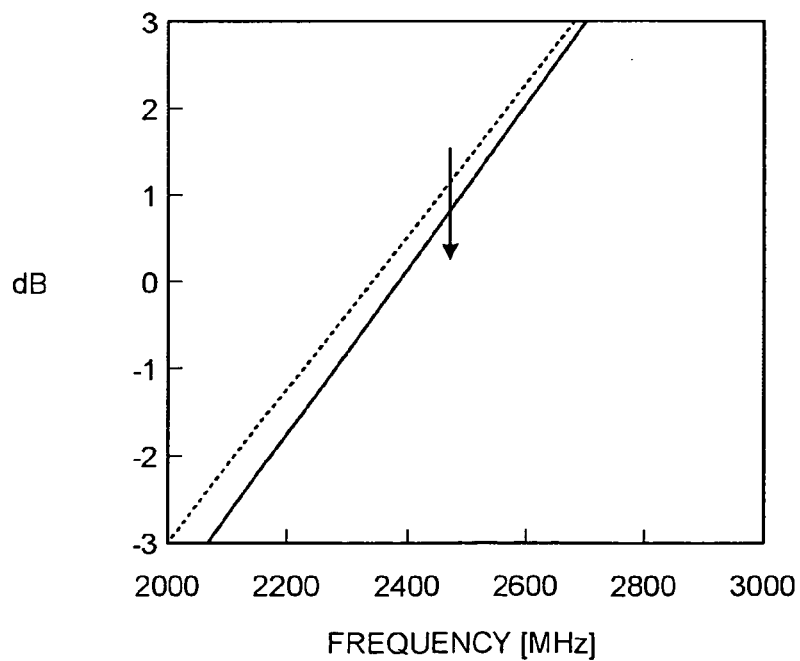
FIG. 17D is a diagram illustrating evaluation results of Example 2 and Comparative Example 1.
Figure 18A:
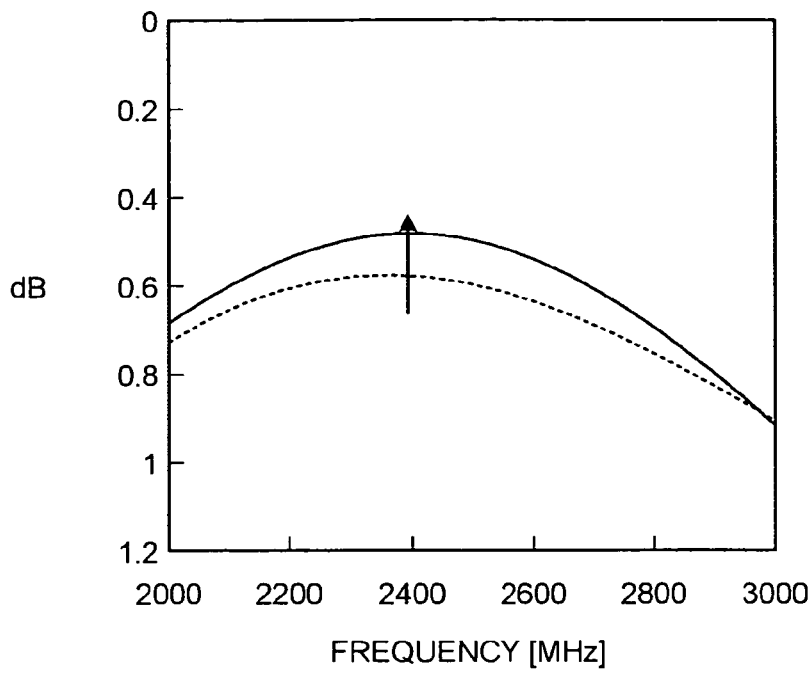
FIG. 18A is a diagram illustrating evaluation results of Example 3 and Comparative Example 1.
Figure 18B:
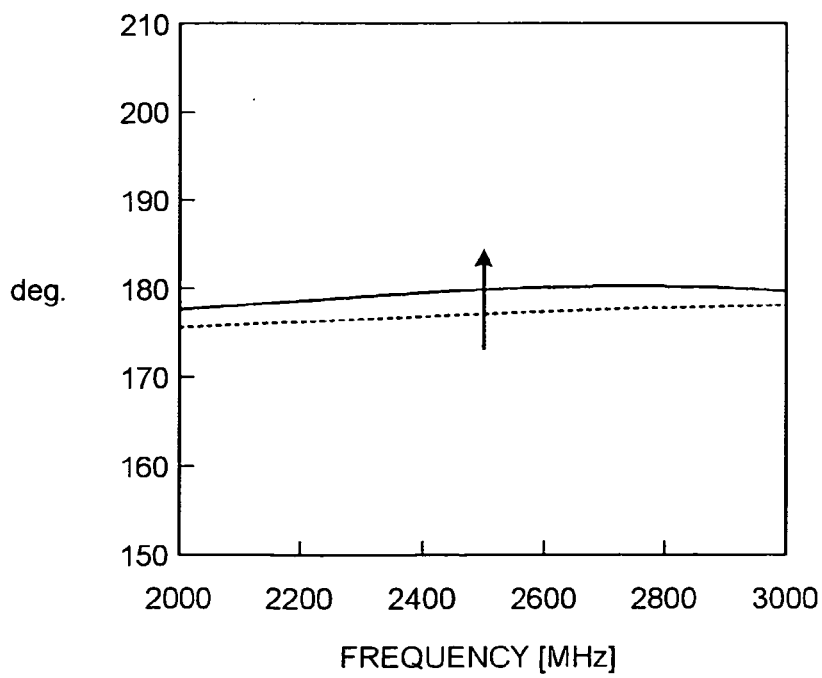
FIG. 18B is a diagram illustrating evaluation results of Example 3 and Comparative Example 1.
Figure 18C:
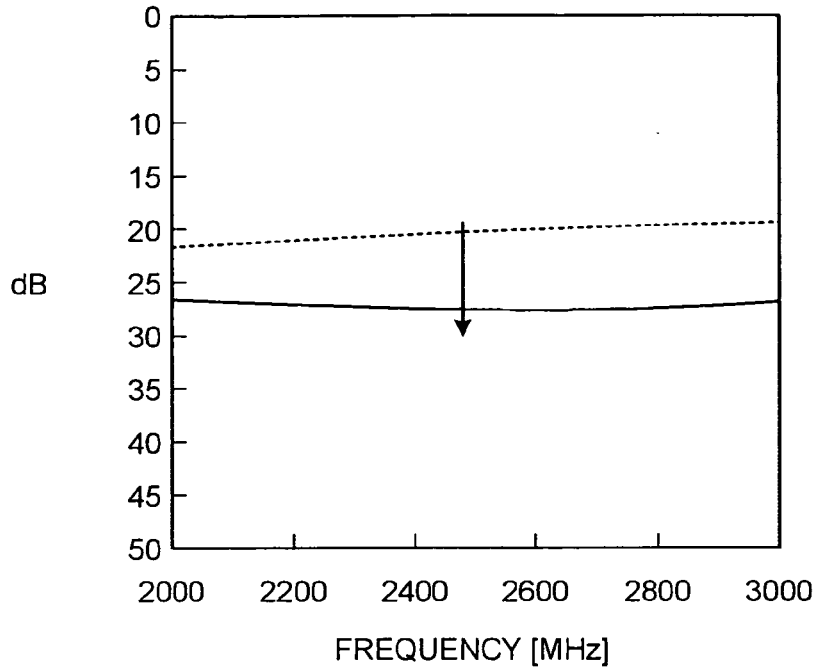
FIG. 18C is a diagram illustrating evaluation results of Example 3 and Comparative Example 1.
Figure 18D:
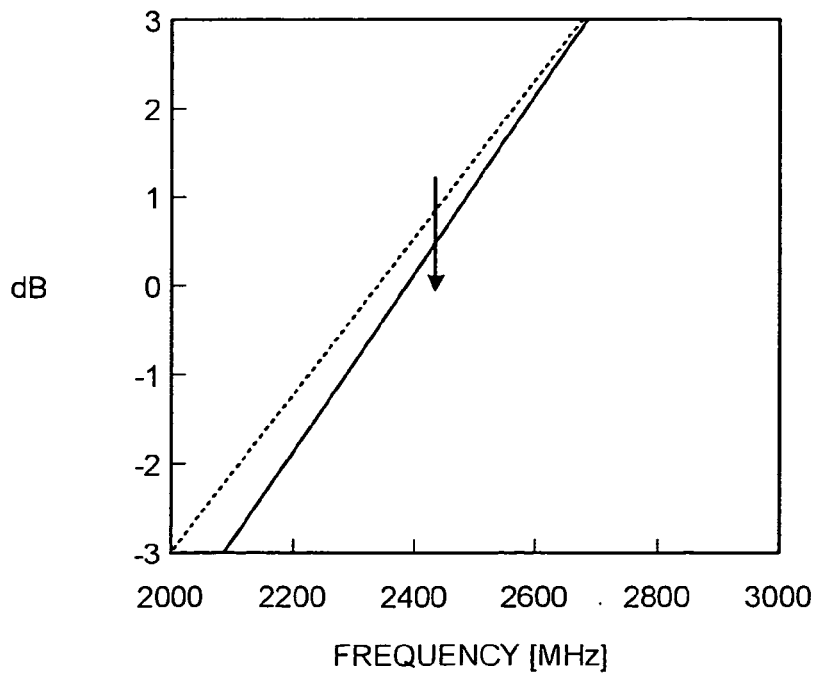
FIG. 18D is a diagram illustrating evaluation results of Example 3 and Comparative Example 1.
Figure 19A:
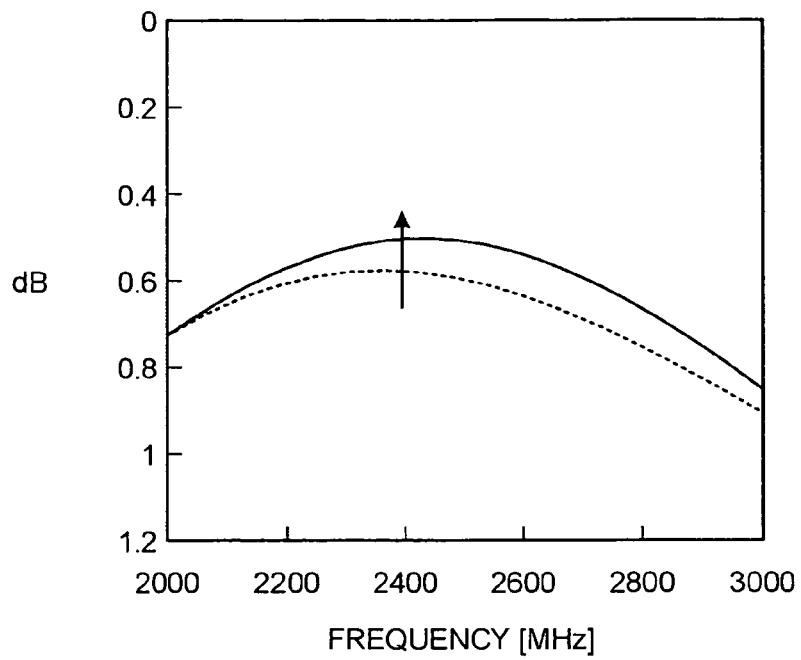
FIG. 19A is a diagram illustrating evaluation results of Example 4 and Comparative Example 1.
Figure 19B:
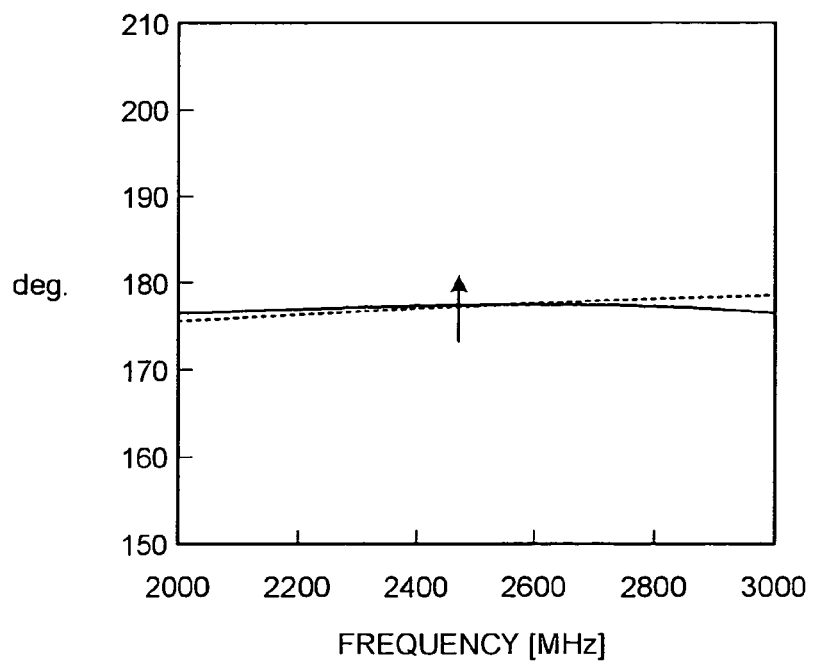
FIG. 19B is a diagram illustrating evaluation results of Example 4 and Comparative Example 1.
Figure 19C:
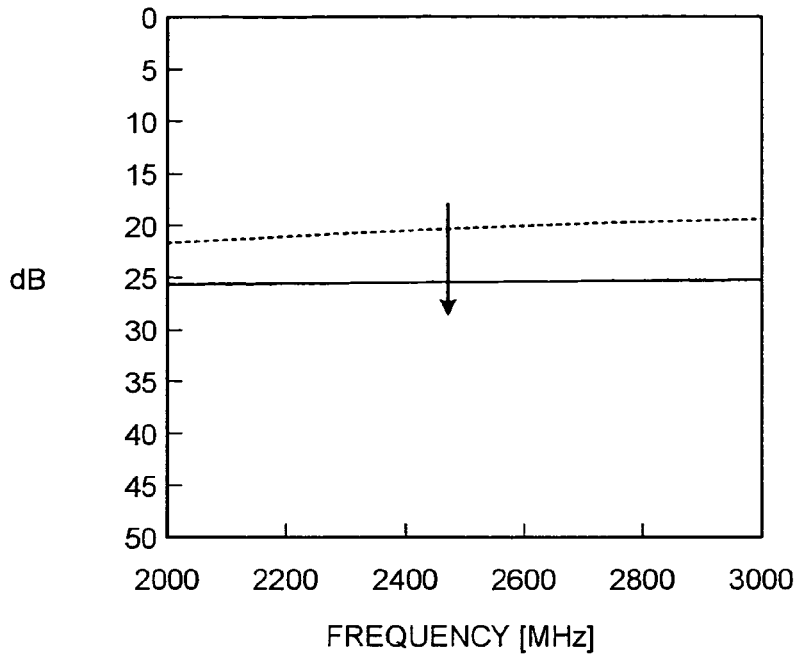
FIG. 19C is a diagram illustrating evaluation results of Example 4 and Comparative Example 1.
Figure 19D:
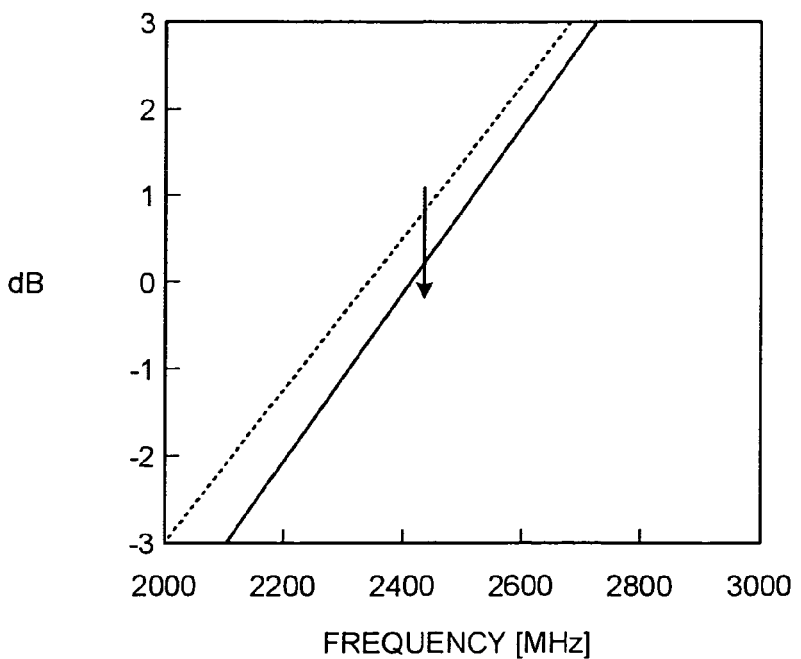
FIG. 19D is a diagram illustrating evaluation results of Example 4 and Comparative Example 1.
Figure 20A:
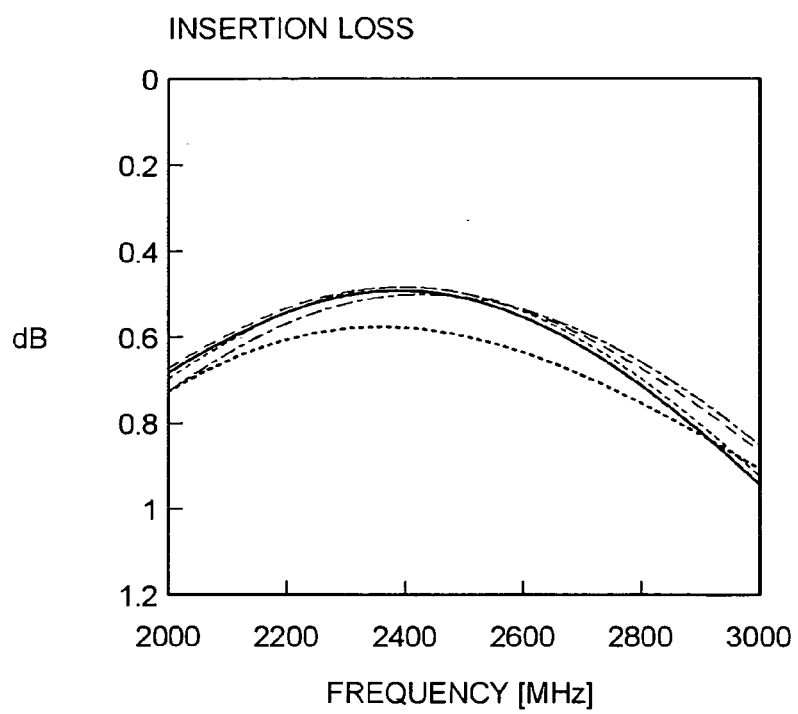
FIG. 20A is a diagram illustrating evaluation results of Example 1 to Example 4 and Comparative Example 1.
Figure 20B:
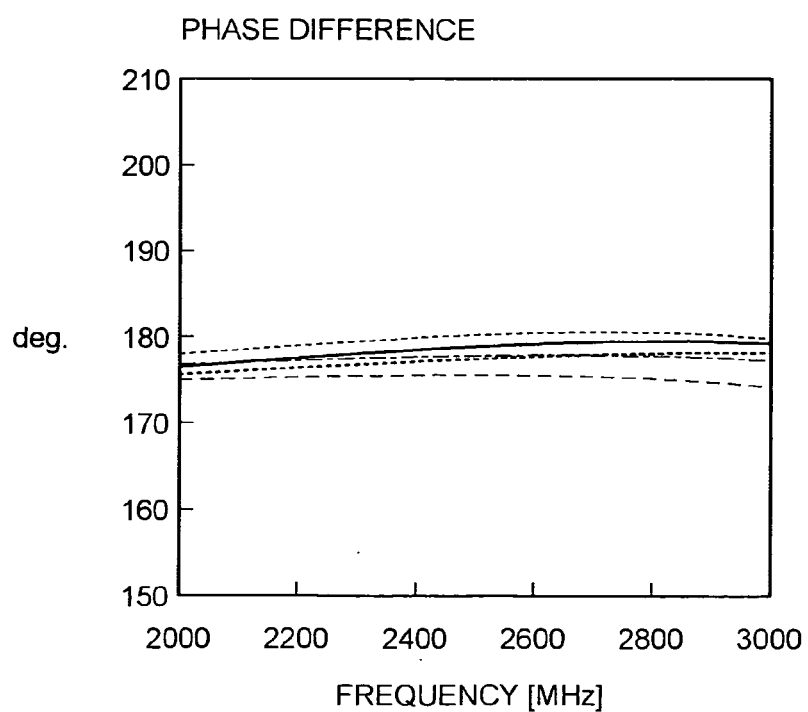
FIG. 20B is a diagram illustrating evaluation results of Example 1 to Example 4 and Comparative Example 1.
Figure 20C:
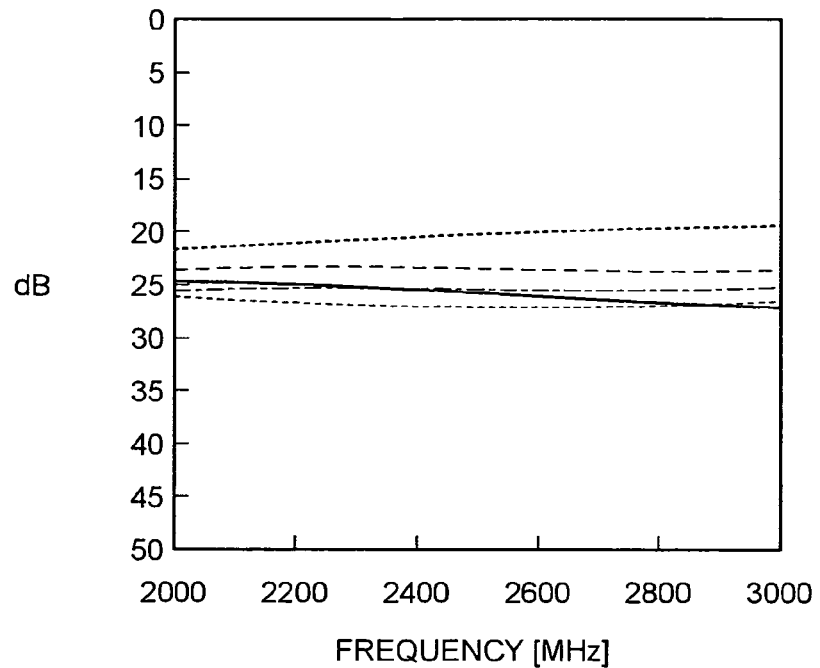
FIG. 20C is a diagram illustrating evaluation results of Example 1 to Example 4 and Comparative Example 1.
Figure 20D:
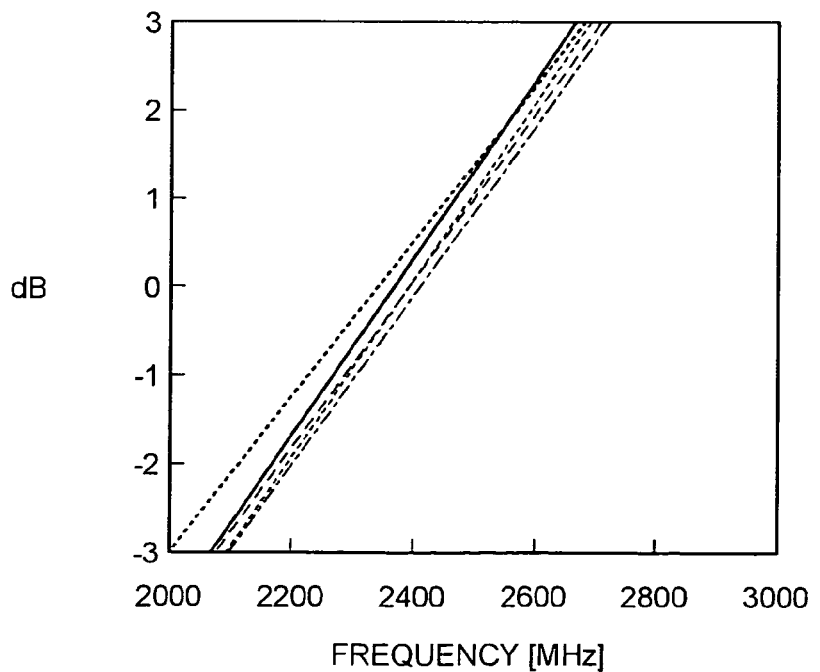
FIG. 20D is a diagram illustrating evaluation results of Example 1 to Example 4 and Comparative Example 1.

FIG. 15 is a plane view of a balun in Comparative Example 2. A balun 101a has terminals of the unbalanced terminal 102, the first balanced terminal 103A, the second balanced terminal 103B, and the ground terminal 108, the low pass filter 106 having the first coil 104A and a first capacitor 105Aa, and the high pass filter 107 having the second coil 104B and a second capacitor 105Ba. In FIG. 15, similarly to FIG. 14, it is intended to show the positional relation on a plain face among the first coil 104A, the second coil 104B, the first capacitor 105Aa, and the second capacitor 105Ba. Therefore, the detail of the laminated structure, as illustrated in the above-mentioned FIG. 3A to FIG. 3E, is omitted and simplified.

For the cross-section structure of the balun 101a, the size of the first capacitor 105A and the second capacitor 105B in Comparative Example 1 is enlarged only. That is, only the area of B1 and B2 in a planar direction is changed from those in the balun 101 in FIG. 13, and the other structure is the same as in Comparative Example 1. In the balun 101a, unlike Comparative Example 1, the capacitors of the first capacitor 105Aa and the second capacitor 105Ba are not housed in the openings of the first coil 104A and the second coil 104B, respectively. However, the values of the capacity of the first capacitor 105Aa and the second capacitor 105Bb are set to be the same as in Example 1 to Example 4 and Comparative Example 1. Moreover, the thickness of the insulating layer I2 for isolating between the conductor layer B2 and the conductor layer M1 is set to be the same as a distance in a planar direction between the first coil 4A and the first capacitor 5A in a laminated direction, similarly to Comparative Example 1.

Evaluation of Example 1

FIG. 16A to FIG. 16D are diagrams illustrating evaluation results of Example 1, Comparative Example 1, and Comparative Example 2. In FIG. 16A to FIG. 16D, a solid line represents electrical properties of Example 1, a dotted line represents electrical properties of Comparative Example 1, and a dashed line represents electrical properties of Comparative Example 2. Considering FIG. 16A to FIG. 16D, there is no significant difference in phase difference properties, while with respect to all of insertion loss properties, amplitude difference properties, and reflection loss properties, Example 1 is more preferable than Comparative Example 1 and Comparative Example 2. In addition, electrical properties are worse on the whole in Comparative Example 2 than in Comparative Example 1. It is recognized that this is because the size of the first capacitor 105Aa and the second capacitor 105Ba in Comparative Example 2 is larger than that of the first capacitor 105A and the second capacitor 105B in Comparative Example 1. That is, the result suggests that in the LC laminated structural type balun, with the structure of Comparative Example 1 and Comparative Example 2, the size of a capacitor has influence on electrical properties.

The following shows the evaluation results of Example 2 to Example 4 and Comparative Example 1. The electrical properties are more preferable to some degree in Comparative Example 1 than in Comparative Example 2. In addition, in Comparative Example 1, the electrode areas of the first capacitor 105A on the side of the low pass filter 106 and the second capacitor 105B on the side of the high pass filter 107 are set to be the same as the electrode areas of the first capacitor 5A on the side of the low pass filter 6 and the second capacitor 5B on the side of the high pass filter 7 in Example 2 to Example 4. Thus, comparison of Comparative Example 1 with Example 2 to Example 4 has greater significance.

Evaluation of Example 2

FIG. 17A to FIG. 17D are diagrams illustrating evaluation results of Example 2 and Comparative Example 1. In FIG. 17A to FIG. 17D, a solid line represents electrical properties of Example 2, and a dotted line represents electrical properties of Comparative Example 1. Considering FIG. 17A to FIG. 17D, although Example 2 is slightly worse in phase difference properties than Comparative Example 1, Example 2 is superior in the overall electrical properties since it provides improved insertion properties, which are considered to be the most important electrical properties.

Evaluation of Example 3

FIG. 18A to FIG. 18D are diagrams illustrating evaluation results of Example 3 and Comparative Example 1. In FIG. 18A to FIG. 18D, a solid line represents electrical properties of Example 3, and a dotted line represents electrical properties of Comparative Example 1. Considering FIG. 18A to FIG. 18D, Example 3 is superior to Comparative Example 1 in all the electrical properties.

Evaluation of Example 4

FIG. 19A to FIG. 19D are diagrams illustrating evaluation results of Example 4 and Comparative Example 1. In FIG. 19A to FIG. 19D, a solid line represents electrical properties of Example 4, and a dotted line represents electrical properties of Comparative Example 1. Considering FIG. 19A to FIG. 19D, Example 4 is superior to Comparative Example 1 in all the electrical properties.

Comparison Among Example 1 to Example 4

FIG. 20A to FIG. 20D are diagrams illustrating evaluation results of Example 1 to Example 4 and Comparative Example 1. In FIG. 20A to FIG. 20D, each of the electrical properties is represented with a solid line for Example 1, a dashed line for Example 2, a dotted line for Example 3, a chain line for Example 4, and a bold line for Comparative Example 1. The result shows that Example 3 has the most preferable electric properties.

The above-mentioned results show that the structure of Example 1 to Example 4 in which the first capacitor 5A and the second capacitor 5B are formed in areas different from the areas where the first coil 4A and the second coil 4B are formed when viewed from a laminated direction, produces greater effect for improving electric properties than the structure of Comparative Example 1 and Comparative Example 2 in which the first capacitor 105A and the second capacitor 105B are formed in the areas where the first coil 104A and the second coil 104B are formed. Moreover, in Example 1 to Example 4, the first capacitor 5A and the second capacitor 5B are arranged in the same area as the first coil 4A and the second coil 4B in a laminated direction. Therefore, it is possible, in Example 1 to Example 4, to realize a lower profile (reduction in size in a laminated direction) than in Comparative Example 1 and the Comparative Example 2 in which the first capacitor 105A and the second capacitor 105B are stacked on the first coil 104A and the second coil 104B.

In Comparative Examples 1 and 2, the first capacitor 105A and the second capacitor 105B are arranged so as to overlap the areas where the first coil 104A and the second coil 104B are arranged when viewed from a laminated direction. Thus, it is assumed that the influence on magnetic fields generated from all conductors at the left, right, top, and bottom of the first coil 104A and the second coil 104B is considerable. The fact that electrical properties are further deteriorated in Comparative Example 2 in which the electrode size of the first capacitor 105A and the second capacitor 105B is larger confirms such a phenomenon.

In Example 1 to Example 4, the first capacitor 5A and the second capacitor 5B are formed in areas different from the areas where the first coil 4A and the second coil 4B are formed, and the first capacitor 5A and the second capacitor 5B are arranged in the same area in the laminated body as the first coil 4A and the second coil 4B in a laminated direction. Therefore, it is assumed that, in Example 1 to Example 4, since the arrangement of the first capacitor 5A and the second capacitor 5B influences significantly only on magnetic fields generated from the conductors most adjacent to the first coil 4A and the second coil 4B, the effect on the improvement of electrical properties is exerted. However, advantageous effects produced in Example 1 to Example 4 are not limited thereto.

The invention is not limited to the embodiments, the modified examples thereof, and Examples that are described above, and various kinds of modification are possible without changing the scope of the invention. For example, the arrangement of the unbalanced terminal, the first balanced terminal, the second balanced terminal, and the ground terminal is not limited to the above-described positions. The multilayer wiring structure constituting a balun may have less than the above-described number of layers. The first coil 4A and the second coil 4B may be formed individually in different conductor layers, or may be formed in the same conductor layer only partially. The electrodes of at least one of the first capacitor 5A and the second capacitor 5B may be provided in the same conductor layer as the first coil 4A or the second coil 4B, or the electrodes of the first capacitor 5A and the second capacitor 5B may be provided in a conductor layer different from the conductor layer in which the first coil 4A and the second coil 4B are formed. The conductor layer in which the electrodes of the first capacitor 5A and the second capacitor 5B are formed is not limited to the first conductor layer and the intermediate conductor layer, and may be constituted by the first conductor layer and the second conductor layer that are the same as the conductors of the first coil 4A and the second coil 4B, or by the second conductor layer and the third conductor layer. It is obvious that the structure may have a reverse order of the conductor layers on the insulating substrate. Various kinds of arrangement and shapes of coils can be adopted without departing from the scope of the invention. For example, the coil shape of both of the first coil 4A and the second coil 4B or one of them may be circular, oval, polygonal such as hexagon, a shape whose corners only are rounded off, meandering, or spiral.

What is claimed is:

1. A laminated structural type balun comprising:
   a low pass filter that is provided between an unbalanced terminal inputting and outputting unbalanced signals and a first balanced terminal inputting and outputting balanced signals and includes a first coil and a first capacitor;
   a high pass filter that is provided between the unbalanced terminal and a second balanced terminal inputting and outputting balanced signals and includes a second capacitor and a second coil; and
   a laminated body that includes a plurality of layers including a plurality of conductor layers having a conductor pattern and a plurality of insulating layers being laminated on a surface of a substrate and includes the low pass filter and the high pass filter, wherein
   the laminated body includes a first conductor layer, a dielectric layer formed on a surface of the first conductor layer, a first insulating layer formed on a surface of the dielectric layer and a second conductor layer formed on a surface of the first insulating layer,
   each of the first capacitor and the second capacitor has a first electrode pattern formed in the first conductor layer and a second electrode pattern formed in the second conductor layer and facing the first electrode pattern,
   the second electrode pattern includes an embedded electrode pattern penetrating through the first insulating layer into the dielectric layer,
   the dielectric layer is interposed between the first electrode pattern and the embedded electrode pattern to electrically isolate them from each other, and
   the first capacitor and the second capacitor are arranged in a different area from the first coil and the second coil when viewed from a laminated direction of the laminated body.

2. The laminated structural type balun according to claim 1, wherein at least one of the first capacitor and the second capacitor is arranged between the first coil and the second coil when viewed from the laminated direction.

3. The laminated structural type balun according to claim 1, wherein at least one of the first capacitor and the second capacitor is arranged between the unbalanced terminal and a ground terminal connected to a ground when viewed from the laminated direction.

4. The laminated structural type balun according to claim 1, wherein at least one of the first coil and the second coil is formed in at least one of the first conductor layer and the second conductor layer.

5. The laminated structural type balun according to claim 1, wherein
at least one of the first coil and the second coil includes a first loop pattern formed in the first conductor layer, a second loop pattern formed in the second conductor layer, and a via conductor penetrating through the first insulating layer and the dielectric layer and connecting the first loop pattern with the second loop pattern.

6. The laminated structural type balun according to claim 1, wherein
a thickness of the dielectric layer is smaller than that of the first insulating layer.

7. The laminated structural type balun according to claim 1, wherein the first capacitor and the second capacitor are arranged between the first coil and the second coil in the laminated direction.

8. The laminated structural type balun according to claim 7, wherein at least one of the first capacitor and the second capacitor is arranged between the first coil and the second coil when viewed from the laminated direction.

9. The laminated structural type balun according to claim 7, wherein at least one of the first capacitor and the second capacitor is arranged between the unbalanced terminal and a ground terminal connected to a ground when viewed from the laminated direction.

10. The laminated structural type balun according to claim 7, wherein at least one of the first capacitor and the second capacitor is arranged in a same area in the laminated body as at least one of the first coil and the second coil in the laminated direction.

11. The laminated structural type balun according to claim 10, wherein at least one of the first capacitor and the second capacitor is arranged between the first coil and the second coil when viewed from the laminated direction.

12. The laminated structural type balun according to claim 10, wherein at least one of the first capacitor and the second capacitor is arranged between the unbalanced terminal and a ground terminal connected to a ground when viewed from the laminated direction.

13. The laminated structural type balun according to claim 10, wherein the first coil and the second coil are arranged in a same area in the laminated body in the laminated direction.

14. The laminated structural type balun according to claim 13, wherein at least one of the first capacitor and the second capacitor is arranged between the first coil and the second coil when viewed from the laminated direction.

15. The laminated structural type balun according to claim 13, wherein at least one of the first capacitor and the second capacitor is arranged between the unbalanced terminal and a ground terminal connected to a ground when viewed from the laminated direction.

16. The laminated structural type balun according to claim 10, wherein the first capacitor and the second capacitor are arranged in a same area in the laminated body as the first coil or the second coil in the laminated direction.

17. The laminated structural type balun according to claim 16, wherein at least one of the first capacitor and the second capacitor is arranged between the unbalanced terminal and a ground terminal connected to a ground when viewed from the laminated direction.

18. The laminated structural type balun according to claim 16, wherein at least one of the first capacitor and the second capacitor is arranged between the first coil and the second coil when viewed from the laminated direction.

19. The laminated structural type balun according to claim 10, wherein the first capacitor and the second capacitor are arranged in a same area in the laminated body as the first coil and the second coil in the laminated direction.

20. The laminated structural type balun according to claim 19, wherein at least one of the first capacitor and the second capacitor is arranged between the first coil and the second coil when viewed from the laminated direction.

21. The laminated structural type balun according to claim 19, wherein at least one of the first capacitor and the second capacitor is arranged between the unbalanced terminal and a ground terminal connected to a ground when viewed from the laminated direction.

* * * * *